US012703191B2

(12) United States Patent
Lee et al.

(10) Patent No.: US 12,703,191 B2
(45) Date of Patent: Aug. 11, 2026

(54) INKJET PRINTING EQUIPMENT

(71) Applicant: UNIJET CO., LTD., Gyeonggi-do (KR)

(72) Inventors: Sung Jin Lee, Seoul (KR); Won Seok Lee, Incheon (KR); Suk Gyu Lee, Seoul (KR); Ho Maeng, Gyeonggi-do (KR); Jung Hun Park, Seoul (KR); Chang Woo Seo, Gyeonggi-do (KR); Se Hyun Sim, Gyeonggi-do (KR); Yeon Jin Jung, Gyeonggi-do (KR)

(73) Assignee: UNIJET CO., LTD., Gyeonggi-do (KR)

( * ) Notice: Subject to any disclaimer, the term of this patent is extended or adjusted under 35 U.S.C. 154(b) by 135 days.

(21) Appl. No.: 18/700,791

(22) PCT Filed: Oct. 17, 2022

(86) PCT No.: PCT/KR2022/015677
§ 371 (c)(1),
(2) Date: Apr. 12, 2024

(87) PCT Pub. No.: WO2023/096158
PCT Pub. Date: Jun. 1, 2023

(65) Prior Publication Data

US 2024/0408895 A1 Dec. 12, 2024

(30) Foreign Application Priority Data

Nov. 25, 2021 (KR) ........................ 10-2021-0163970

(51) Int. Cl.
*B41J 3/407* (2006.01)
*B41J 2/165* (2006.01)
(Continued)

(52) U.S. Cl.
CPC ........... *B41J 3/407* (2013.01); *B41J 2/16526* (2013.01); *B41J 2/16579* (2013.01);
(Continued)

(58) Field of Classification Search
None
See application file for complete search history.

(56) References Cited

U.S. PATENT DOCUMENTS 5,023,695 A * 6/1991 Umezawa ........... H01L 23/4735 257/714
7,334,588 B2 * 2/2008 Verhaverbeke ........... B08B 3/12 134/147

(Continued)

FOREIGN PATENT DOCUMENTS

JP 2011-115696 A 6/2011
JP 2011-233569 A 11/2011

(Continued)

OTHER PUBLICATIONS

International Search Report for PCT/KR2022/015677 mailed on Jan. 18, 2023.

(Continued)

*Primary Examiner* — Alejandro Valencia
(74) *Attorney, Agent, or Firm* — The PL Law Group, PLLC

(57) ABSTRACT

An inkjet printing equipment includes a work holder which fixes the object to be printed, a work holder moving part which allows the work holder to be linearly movable in a Y-axis direction, a base on which the work holder moving part is installed, a head part which is installed on the base and sprays an ink onto the object to be printed, a head part moving part which moves the head part in an X-axis direction and is installed above the base, an ink curing part installed above the work holder and on a moving path of the
(Continued)

work holder in the Y-axis direction, and an enclosure which covers all of the work holder, the head part, and the ink curing part.

16 Claims, 23 Drawing Sheets

(51) Int. Cl.

| | |
|---|---|
| ***B41J 11/00*** | (2006.01) |
| ***B41J 25/00*** | (2006.01) |
| ***B41J 25/308*** | (2006.01) |
| ***B41J 29/377*** | (2006.01) |
| *H10K 59/80* | (2023.01) |
| *H10K 71/40* | (2023.01) |

(52) U.S. Cl.
CPC ....... *B41J 11/00214* (2021.01); *B41J 25/001* (2013.01); *B41J 25/308* (2013.01); *B41J 29/377* (2013.01); *H10K 59/873* (2023.02); *H10K 71/40* (2023.02)

(56) References Cited

U.S. PATENT DOCUMENTS

| | | | | |
|---|---|---|---|---|
| 2005/0184436 | A1 | 8/2005 | Jeong et al. | |
| 2010/0072672 | A1 | 3/2010 | Jeong et al. | |
| 2011/0117291 | A1* | 5/2011 | Hiroshiro | B82Y 40/00 118/313 |
| 2015/0079301 | A1 | 3/2015 | Nemani et al. | |
| 2019/0221461 | A1* | 7/2019 | Kawadahara | H01L 21/67282 |
| 2021/0364729 | A1* | 11/2021 | Lee | G02B 7/09 |
| 2022/0016665 | A1* | 1/2022 | Lee | B05C 5/0262 |

FOREIGN PATENT DOCUMENTS

| | | | |
|---|---|---|---|
| JP | 2016-529649 | A | 9/2016 |
| KR | 10-2007-0048483 | A | 5/2007 |
| KR | 10-2012-0093563 | A | 8/2012 |
| KR | 10-2015-0011177 | A | 1/2015 |
| KR | 10-2021-0108890 | A | 9/2021 |
| WO | WO 2017/164031 | A1 | 9/2017 |

OTHER PUBLICATIONS

Office action issued on Nov. 18, 2023 from Korean Patent Office in a counterpart Korean Patent Application No. 10-2021-0163970(all the cited references are listed in this IDS.) (English translation is also submitted herewith.).

Office action issued on Jul. 2, 2024 from Japan Intellectual Property Office in a counterpart Japanese Patent Application No. 2023-540923 (all the cited references are listed in this IDS.) (English translation is also submitted herewith.).

* cited by examiner

INKJET PRINTING EQUIPMENT

CROSS REFERENCE TO RELATED APPLICATIONS AND CLAIM OF PRIORITY

This application claims benefit under 35 U.S.C. 119, 120, 121, or 365 (c), and is a National Stage entry from International Application No. PCT/KR2022/015677 filed on Oct. 17, 2022, which claims priority to the benefit of Korean Patent Application No. 10-2021-0163970 filed in the Korean Intellectual Property Office on Nov. 25, 2021, the entire contents of which are incorporated herein by reference.

BACKGROUND

1. Technical Field

The present invention relates to an inkjet printing equipment, and more particularly, to an inkjet printing equipment reduced in size to be suitable for a small object to be printed, and capable of minimizing generation of contaminants generated during printing.

2. Background Art

In recent years, OLED displays are widely used as display technologies are developed.

The OLED displays use organic materials, and these organic materials are susceptible to moisture and oxygen. Thus, a process of manufacturing the OLED displays essentially includes a thin film encapsulation process.

The encapsulation process includes a process of stacking an inorganic thin film and an organic thin film, and in order to stack each of the layers, this encapsulation process includes a process of forming an over coating layer (OCL).

In particular, a micro OLED display is used as a near to eye display as a virtual view type, which means VR/AR/MR/XR and the like as we know.

First of all, a high resolution and a high responsiveness are required to realize a virtual image like a real image.

In addition, the micro OLED display is required to be light like eyeglasses and low in power consumption like an earphone, and thus the micro OLED display has a top emission structure using an OLED and a transparent electrode on a CMOS silicon backplane.

In addition, additional layers such as a TFE layer and RGB color filters, which block moisture and oxygen to which the OLED is susceptible, are installed. A cover glass or the like is installed on the uppermost portion. In a RGB OLED, the RGB color filter may be omitted.

An existing manufacturing process uses a photolithography process and a deposition method.

Specifically, an over coating layer is first formed on a CMOS wafer by using a spin coater (track system), followed by planarization, and an anode (hole) is achieved using photolithography (Coater-Oven-Mask & Exposure-Developer-Strip).

A white OLED sub-pixel is manufactured using an organic evaporator, and then a cathode (ITO) layer is stacked through metal deposition.

According to the related art, when an organic light emitting layer process is completed, a TFE layer that blocks moisture and oxygen is manufactured. According to the related art, the TFE layer is manufactured through chemical vapor deposition (CVD)-atomic layer deposition (ALD)-plasma enhanced chemical vapor deposition (PECVD)-ALD layer manufacturing, and then, a planarization coating of about 1 um using the spin coater (track system) again.

Each of the color filters is manufactured on a planarization layer using photolithography (Coater-Oven-Mask & Exposure-Developer-Strip). A planarization layer is manufactured on the color filters by using the spin coater, and finally, a cover glass is installed through an adhesive process (OCR) to commercialize a product.

This thin film encapsulation process of the micro OLED display requires an organic thin film to be coated in a small thickness of about 0.5 μm or less.

This is because pixels of the micro OLED display have a very small size of 2.4 μm or less, and thus, when the thin film is formed to have a thickness of 0.5 μm or more, light emitted from each pixel of the micro OLED display in a diagonal direction easily causes light interference with a neighboring pixel.

Thus, each of an organic thin film layer for the thin film encapsulation and an OCR layer for adhering glass is required to be coated in a thickness of 0.5 μm or less.

In this thin film encapsulation process, a planarization operation of each layer constituting a thin film is performed by applying a deposition solution using the spin coater.

However, the solution pushed to the outside of the wafer during this applying operation is in contact with a robot end effector or the like to cause process contamination.

Accordingly, an additional process such as optical edge bead removal (OEBR) is required. In particular, when a coating layer is directly applied instead of a photoresist, a process defect due to contamination (air bubbles and particles) may be generated.

Therefore, the method using the existing equipment has limitations in that the thin film encapsulation process is prone to process contamination, and an additional equipment or fixing operation is required to prevent the process contamination.

To solve the limitations, use of an inkjet printing equipment is increasing.

However, unlike the present invention, an existing inkjet printing equipment is not applied to the micro OLED display process, and thus, the equipment is large in size. Thus, there are various limitations such as particle generation during the thin film encapsulation process.

For example, a head part is transferred downward directly onto a substrate to perform a printing operation, and this involves a limitation that particles are generated.

In addition, a separate cooling device is required to cool the wafer after a deposition process is completed, and a UV curing device is also separately installed. Thus, there is a limitation in that the size of the equipment is increased.

Moreover, there is a limitation that in addition to an ink printed on the wafer, the ink scattered on the equipment during a printing operation is cured together during a UV curing process.

This invention was supported by National research and development project supporting the invention (Project Identification Number: 1415174162; Project Number: 20016332; Government department name: Ministry of Environment; Project Management (professional) institution name; Korea Planning & Evaluation Institute of Industrial Technology; Research Title: Post InP electroluminescent quantum dot material device and process technology development; Research Project Title: Materials and parts technology development (R&D); Contribution Ratio: 1/1; Project Performing organization Name: JI Tech Co., Ltd.; Research Period: Apr. 1, 2021 to Dec. 31, 2024) awarded by Ministry of Trade, Industry and Energy.

SUMMARY

The invention addresses the above-identified and other problems associated with conventional methods and apparatuses, and provides an inkjet printing equipment reduced in size to be suitable for a small object to be printed, and capable of minimizing generation of contaminants generated during printing.

According to an embodiment of the invention, there is provided an inkjet printing equipment including a work holder 2000 which fixes the object to be printed, a work holder moving part 1200 which allows the work holder 2000 to be linearly movable in a Y-axis direction, a base 1000 on which the work holder moving part 1200 is installed, a head part 3000 which is installed on the base 1000 and sprays an ink onto the object to be printed, a head part moving part 1400 which moves the head part 3000 in an X-axis direction and is installed above the base 1000, an ink curing part 4000 installed above the work holder 2000 and on a moving path of the work holder 2000 in the Y-axis direction, and an enclosure 5000 which covers all of the work holder 2000, the head part 3000, and the ink curing part 4000.

In the inkjet printing equipment according to an embodiment of the invention, the work holder 2000 includes a wafer support part 2100 installed on the work holder moving part 1200, a first upward moving part 2200 installed inside the wafer support part 2100, and a work holder body 2300 installed above the first upward moving part 2200. The first upward moving part 2200 is provided to allow the work holder body 2300 to be movable in a Z-axis direction.

In the inkjet printing equipment according to an embodiment of the invention, the wafer support part 2100 includes a support 2110 installed to extend upward from the work holder moving part 1200, and a wafer support member 2120 installed on an upper portion of the support 2110. The wafer support member 2120 includes a horizontal support 2121 extending from an upper end of the support 2110 to the inside of an XY plane and having a triangular flat plate shape, and a wafer support rod 2122 extending upward from an end of the horizontal support 2121. The wafer support rod 2122 includes a horizontal member 2122*a* installed to further extend inward from the horizontal support 2121, and a vertical member 2122*b* provided at an upper side with respect to the horizontal member 2122*a*. Two rollers r are installed on an upper end of the vertical member 2122*b* to have different heights in the Z-axis direction.

In the inkjet printing equipment according to an embodiment of the invention, the first upward moving part 2200 includes a first upward driving part F installed on the work holder moving part 1200, and a first relatively movable part M installed above the first upward driving part F. The first upward driving part F includes a first ball screw F2, which is installed to extend from a bottom surface 2001*a* having a flat plate shape of a work holder bottom member 2001 in the Y-axis direction and is driven by a first motor F1, and a first inclined block F3 which is linearly moved by the first ball screw F2. A first lower rail part F5, on which a first lower slider F4 is installed, is installed below the first inclined block F3, and a bottom surface of the first inclined block F3 is fixed to the first lower slider F4. The first inclined block F3 is provided to be inclined so that a height of a top surface of the first inclined block F3 gradually increases in a Y-axis backward direction. A first fixing guide part F6 extending in a Z-axis upward direction is installed at each of both sides of the first inclined block F3, and a first side rail F8, which extends in the Z-axis upward direction and on which a first side slider F7 is installed, is provided outside the first fixing guide part F6. The first relatively movable part M includes a first support plate M1, a first inclined part M2 installed below a center of the first support plate M1, and a first movement guide member M3 installed at each of both sides of the first inclined part M2. A bottom surface of the first inclined part M2 is provided to be inclined so that the first inclined part M2 has a shape corresponding to a top surface of the first inclined block F3. A first upper rail M5, on which a first upper slider M4 is installed, is installed on the bottom surface of the first inclined part M2, and the top surface of the first inclined block F3 is fixed to the first upper slider M4. The first movement guide member M3 is provided to extend in the Z-axis upward direction, and an inner side the first movement guide member M3 is fixed to the first side slider F7.

In the inkjet printing equipment according to an embodiment of the invention, the work holder body 2300 includes a support column 2340 extending from an upper portion of the first support plate M1 in the Z-axis upward direction, and a wafer support plate 2350 installed on an upper end of the support column 2340. The support column 2340 is provided at each of corners to correspond to the wafer support rod 2122 provided on the support 2110. The support column 2340 is provided at a position at which when the work holder body 2300 moves in the Z-axis direction, an interference of the horizontal support 2121 does not occur. A support rod guide groove 2341, which extends in the Z-axis direction so that when the work holder body 2300 moves in the Z-axis direction, the wafer support rod 2122 is guided, is defined in an inner side of the support column 2340.

In the inkjet printing equipment according to an embodiment of the invention, the wafer support plate 2350 includes a cooling plate 2351 installed on a lower portion thereof, and a wafer fixing plate 2352 installed above the cooling plate 2351. A guide groove 2351*a* is defined in an edge of the cooling plate 2351 so that the wafer support rod 2122 is movable in the Z-axis direction, a passage 2351*b* through which a first cooling fluid S1 flows is defined at a center of the cooling plate 2351, and an inlet 2351*c* and an outlet 2351*d* which communicate with the passage 2351*b* are defined in a side surface of the cooling plate 2351. A guide groove 2352*a* is defined in the wafer fixing plate 2352 so that the wafer support rod 2122 is movable in the Z-axis direction, a vacuum adsorption hole 2352*b* through which the wafer is fixed is defined at a center of the wafer fixing plate 2352, and a vacuum suction hole 2352*c* and a vacuum discharge hole 2352*d* which communicate with the vacuum adsorption hole 2352*b* are defined in a side surface of the wafer fixing plate 2352. A temperature sensor 2354 is installed on a bottom surface of the wafer fixing plate 2352. The inlet 2351*c* and the outlet 2351*d* are connected to a chiller 6000, and the chiller 6000 adjusts a temperature of the first cooling fluid S1 so that a temperature detected by the temperature sensor 2354 is maintained to be a preset temperature.

In the inkjet printing equipment according to an embodiment of the invention, the work holder 2000 further includes a work holder cover part 2400, and the work holder cover part 2400 includes a first cover part 2410 which covers the wafer support part 2100 and the first upward moving part 2200, and a second cover part 2420 which covers the work holder body 2300. The first cover part 2410 has an upper portion that is opened to be fixed to the work holder moving part 1200. An opened groove 2411, which has an upper portion that is opened so that the work holder body 2300 is movable in the Z-axis direction, is defined in an upper portion of the first cover part 2410. A first sealing 2412 is installed along an inner perimeter of the opened groove 2411. An opened portion 2411 is defined so that upper and lower portions of the second cover part 2420 are opened. The upper portion of the second cover part 2410 is fixed to the wafer support plate 2350 so that when the work holder body 2300 moves in the Z-axis direction, the second cover part 2410 moves together. A first flange 2421 having a flat plate shape is provided along a lower perimeter of the second cover part 2420 so as to be in contact with the first sealing 2412 when the work holder body 2300 moves upward.

In the inkjet printing equipment according to an embodiment of the invention, the head part 3000 includes a chamber 3100 having a rear surface fixed to the head part moving part 1400, a head driving part 3200 installed inside the chamber 3100, a head 3300 which is installed below the head driving part 3200, driven by the head driving part 3200, and protrudes from a lower portion of the chamber 3100, and a head inspecting part 3400 installed below the head part 3000.

In the inkjet printing equipment according to an embodiment of the invention, the head inspecting part 3400 includes a second upward moving part 3410 installed on the base 1000, a purging cup support part 3420 installed above the second upward moving part 3410 and provided with a purging cup 3440, an inspecting part 3450 which inspects an ink sprayed into the purging cup 3440, and an inspecting part moving part 3430 which allows the inspecting part 3450 to be movable in the X-axis or Y-axis directions with respect to the purging cup 3440. The second upward moving part 3410 is provided to allow the purging cup support part 3420 to be movable in the Z-axis direction so that the purging cup 3440 covers the head 3300.

In the inkjet printing equipment according to an embodiment of the invention, the purging cup support part 3420 includes a first horizontal support part 3421 fixed to the second upward moving part 3410 and having a flat plate shape, a vertical support part 3422 extending vertically from the first horizontal support part 3421, and a second horizontal support part 3423 fixed to the vertical support part 3422 and having a flat plate shape. The inspecting part moving part 3430 is installed on the first horizontal support part 3421, and the purging cup 3440 is installed on the second horizontal support part 3423.

In the inkjet printing equipment according to an embodiment of the invention, the purging cup 3440 includes a case 3441 installed on the purging cup support part 3420, a transparent part 3442 installed above the case 3441, and a discharge passage 3443 which is installed on the case 3441 through which the sprayed ink is discharged. The transparent part 3442 is provided so that ultraviolet light is blocked.

In the inkjet printing equipment according to an embodiment of the invention, the ink curing part 4000 includes a case 4100 installed at an upper side inside the enclosure 5000, and a curing device 4200 installed inside the case 4100.

In the inkjet printing equipment according to an embodiment of the invention, an opened groove 4101 having a rectangular shape penetrated downward, and provided to be stepped downward is defined in a bottom surface of the case 4100. A glass plate fixing member 4110 is installed below the stepped opened groove 4101. The glass plate fixing member 4110 includes a frame 4111 provided to be stepped to have a shape corresponding to the stepped opened groove 4101, and a glass plate 4112 installed at a center of the frame 4111. An extension 4111*a* extending inward to support the glass plate 4112 is provided on an upper portion of the frame 4111, a first stepped groove 4111*b* is defined along an inner perimeter of the frame 4111, and a second stepped groove 4111*c* having a greater width is defined below the first stepped groove 4111*b*. A second flange 4111*d* having a shape corresponding to the stepped opened groove 4101 is provided along an outer lower perimeter of the frame 4111. A sealing member 4120 fixed to a lower portion of the glass plate fixing member 4110 includes a frame member 4121 having a center in which a through-groove 4121*a* is defined, and a second sealing 4122 provided along an inner perimeter of the through-groove 4121*a*.

In the inkjet printing equipment according to an embodiment of the invention, the ink curing part 4000 is operated after the work holder body 2300 is moved upward by the first upward moving part 2200 so that the wafer fixing plate 2352 presses the second sealing 4122, and the first flange 2421 presses the first sealing 2412.

In the inkjet printing equipment according to an embodiment of the invention, the ink curing part 4000 is further operated after the purging cup 3440 is moved upward by the second upward moving part 3410 to cover the head 3300.

In the inkjet printing equipment according to an embodiment of the invention, the enclosure 5000 includes an enclosure box 5100 which covers all of the work holder 2000, the head part 3000, and the ink curing part 4000, and a circulator 5200 installed above the enclosure box 5100. The enclosure box 5100 has a shape having an upper portion and a lower portion that are opened. A glove box 5110, in which rubber gloves for maintenance and repairs of the inkjet printing equipment are installed, is defined in a front surface or a side surface of the enclosure box 5100. A wafer inlet 5120 into which the wafer is inserted in the Y-axis direction is defined in one side of a rear surface of the enclosure box 5100. In the other side of the rear surface of the enclosure box 5100, a circulation inlet 5131 which allows a nitrogen gas filled in the enclosure 5000 to flow is defined, and a circulation passage 5130 extending in the Z-axis direction to communicate with the circulation inlet 5131 is defined.

In the inkjet printing equipment according to an embodiment of the invention, the circulator 5200 includes a cooling box 5210 connected to the circulation passage 5130, and a blower 5220 installed below the cooling box 5210. The cooling box 5210 includes a box case 5211 installed above the blower 5220, and a heat exchanger 5212 fixed to an inner bottom surface of the box case 5211. A rear surface of the box case 5211 is opened to communicate with the circulation passage 5130, and an opened portion 5211*a* is defined in a bottom surface of the box case 5211 so as to communicate to allow the nitrogen gas passing through the heat exchanger 5212 to flow downward. The heat exchanger 5212 is provided so that a second cooling fluid S2 flows through an inflow port 5212*a* and a discharge port 5212*b* that are defined in an upper portion of the box case 5211.

In the inkjet printing equipment according to an embodiment of the invention, the blower 5220 includes a blower case 5221 installed above the enclosure box 5100, a blower part 5222 installed inside the blower case 522, and a filter part 5223 installed below the blower part 5222. The filter part 5223 has a size greater than a size of the enclosure box 5100 on the XY plane.

In the inkjet printing equipment according to an embodiment of the invention, when the curing device 4200 is operated, the chiller 6000 adjusts the temperature of the first cooling fluid S1 so that the temperature detected by the temperature sensor 2354 is maintained to be the pre-set temperature.

According to the embodiment of the invention, the printing and curing operations are performed inside one enclosure to have the effect that the inkjet equipment is compact in size.

In the inkjet printing equipment according to the embodiment of the invention, particularly the filter part is provided to have the plane wider than the plane of the enclosure box. Accordingly, the downflow of the nitrogen gas which passes through the filter part to flow downward allows everything to move downward over the entirety of the plane of the enclosure box.

Accordingly, all of the dusts, the mists or the like move downward to have the effect that the inside of the enclosure box is maintained to be clean throughout all the processes in the inkjet printing equipment.

In the inkjet printing equipment according to the embodiment of the invention, the wafer being in the high temperature state through the previous deposition process is cooled, and then the printing step is performed to have the effect that the rate of the defects occurring due to the high temperature and the imbalance in material temperature is reduced.

In the inkjet printing equipment according to the embodiment of the invention, the head part moves only in the X-axis direction and does not move in the Z-axis direction. Accordingly, there is the effect that the dusts, the foreign matters or the like are fundamentally prevented from occurring due to the transfer of the head part.

In addition, the operation is performed so that the chamber is moved in the X-axis direction in the state in which the head driving part is installed inside the chamber having the sealed shape. Accordingly, there is the advantage that the particles generated during the driving of the head by the head driving part are fundamentally prevented from being dropped onto the substrate.

In addition, the work holder is provided to move upward in the state in which the ink curing part is fixed also in the curing step. Accordingly, there is the effect that the dusts or the like are also prevented from occurring due to the transfer of the ink curing part.

In particular, in the embodiment of the invention, the ultraviolet light generated by the curing device in the curing step is double blocked by the work holder cover. Accordingly, there is the effect that the inks or the foreign matters present inside the enclosure are prevented from being cured during the curing.

In addition, in the curing step, the head part is covered and sealed by the purging cup made of the ultraviolet blocking glass. Accordingly, there is the effect of preventing the phenomenon in which the inks remaining on the head are cured on the head surface to cause the defect in the following printing operation.

DETAILED DESCRIPTION

Hereinafter, embodiments of the invention will be described with reference to the accompanying drawings.

Figure 1:
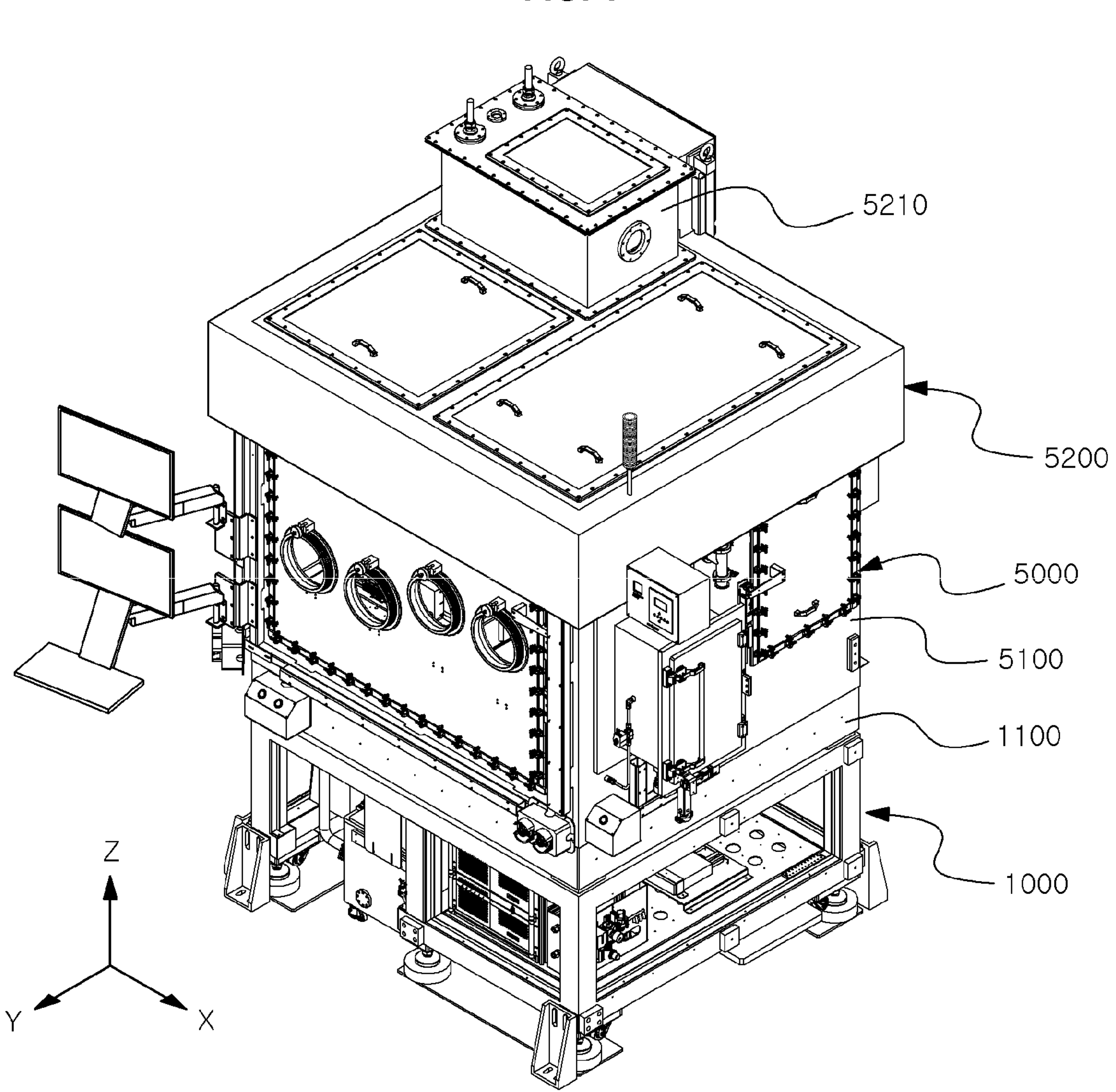
FIG. 1 is a view illustrating the entirety of an inkjet printing equipment according to an embodiment of the invention.
Figure 2:
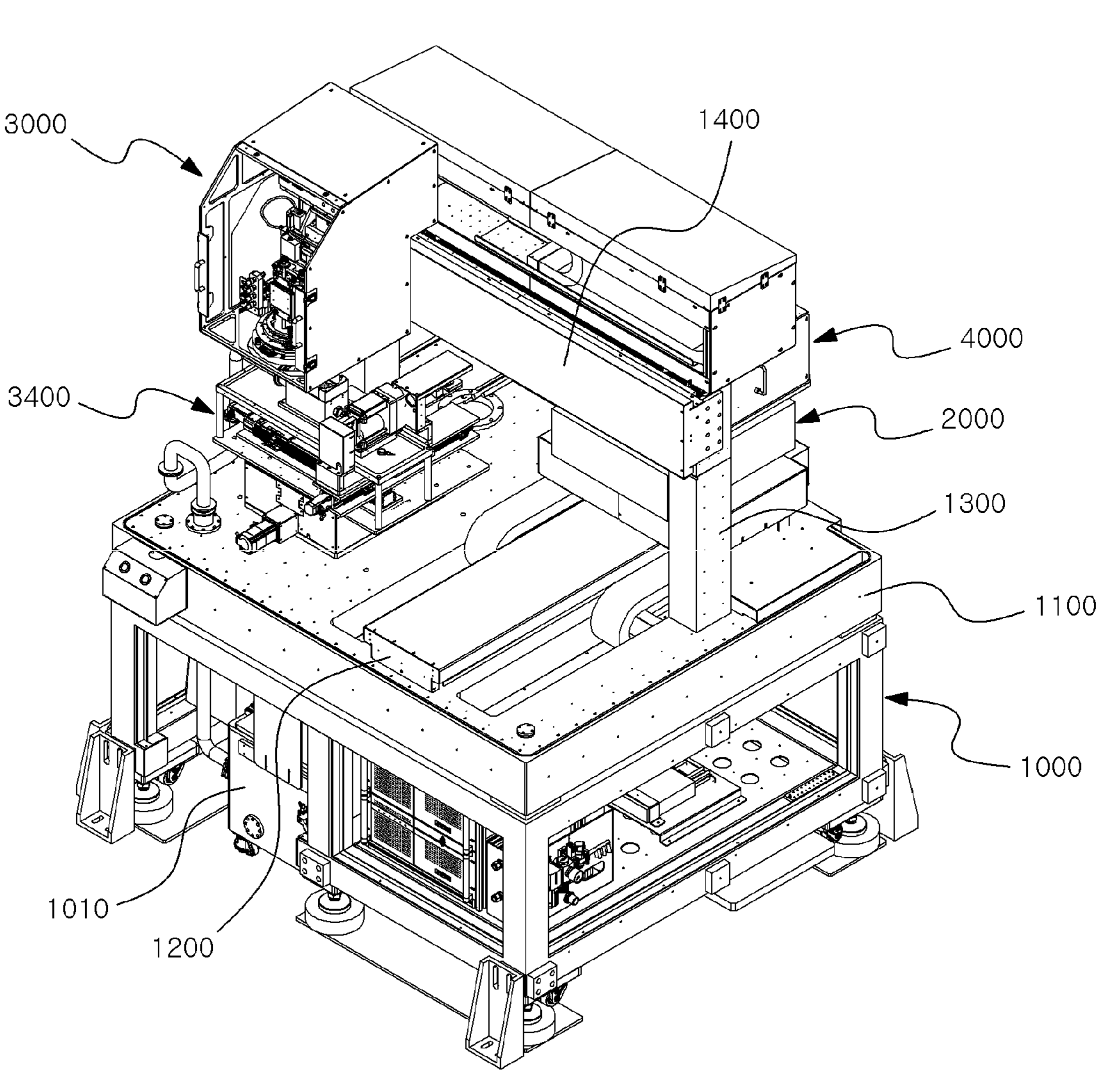
FIG. 2 is a view illustrating a state except for an enclosure in FIG. 1.

FIG. 1 is a view illustrating the entirety of an inkjet printing equipment according to an embodiment of the invention. FIG. 2 is a view illustrating a state except for an enclosure in FIG. 1.

An inkjet printing equipment according to an embodiment of the invention includes a base 1000, a work holder 2000 which is installed to be linearly movable on the base 1000 in a Y-axis direction and supports an object, a head part 3000 which is installed above the base 1000 to be linearly movable in an X-axis direction and sprays an ink onto an object to be printed, and an ink curing part 4000 which is installed above the base 1000 in a Y-axis backward direction, and an enclosure 5000 which is provided to cover all of the work holder 2000, the head part 3000, and the ink curing part 4000 and is fixed onto the base.

Figure 3:
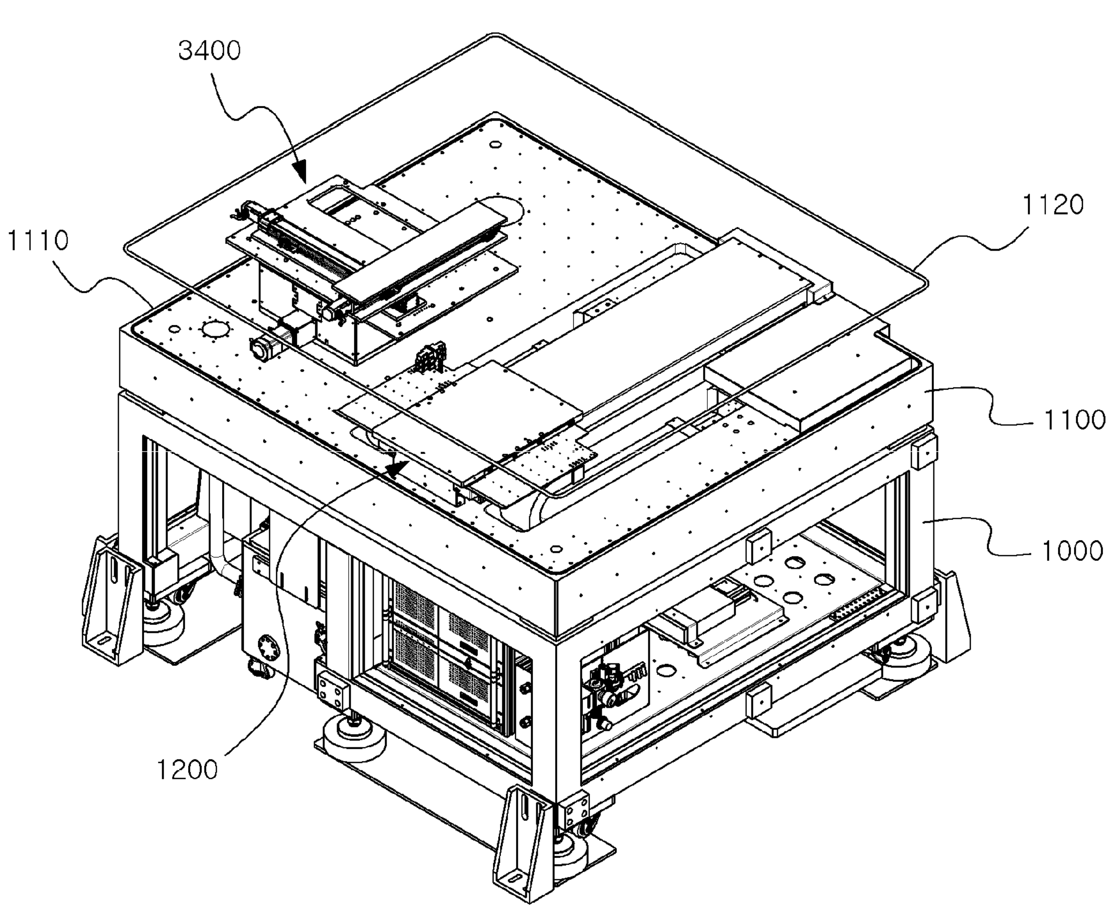
FIG. 3 is a view illustrating a base according to an embodiment of the invention.

FIG. 3 is a view illustrating a base according to an embodiment of the invention.

The base 1000 may be provided in the form of a skeleton-shaped frame as a whole.

A cleaning filter part 1010 that purges an ink used during inspection is installed on a lower portion of the base 1000.

A stage 1100 is installed above the base 1000, and a sealing groove 1110 into which a base sealing member 1120 is inserted is defined in edges of the stage 1100.

Figure 4:
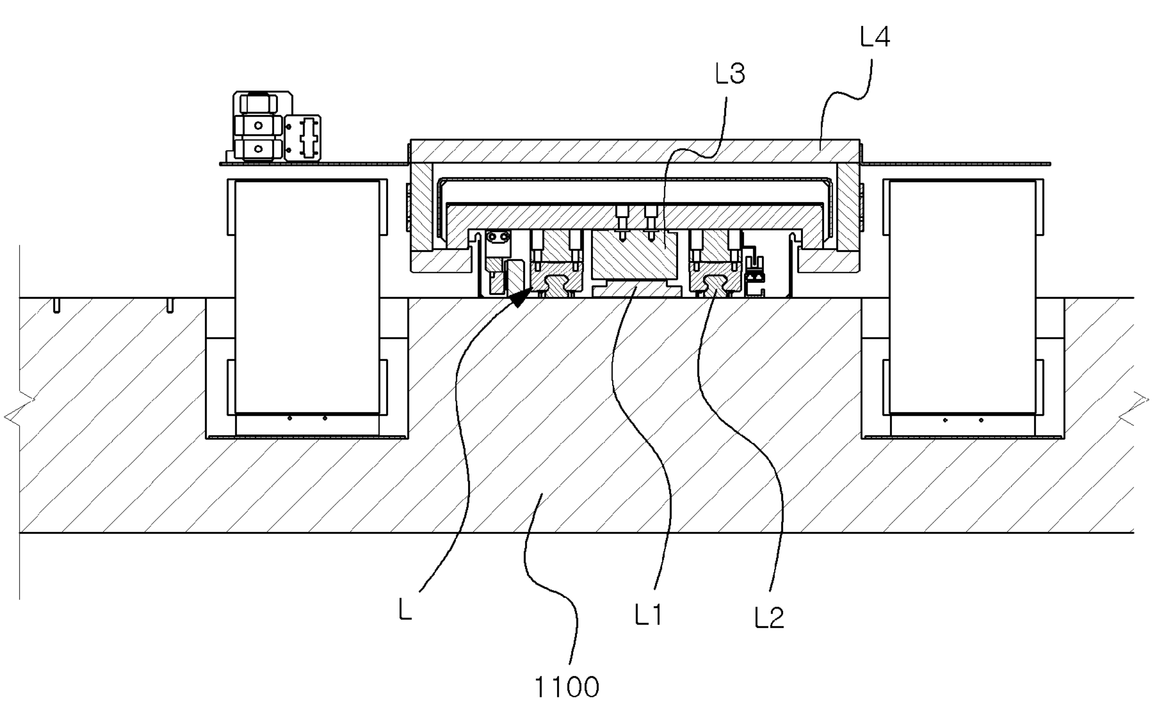
FIG. 4 is a cross-sectional view illustrating a work holder moving part according to an embodiment of the invention.

FIG. 4 is a cross-sectional view illustrating a work holder moving part according to an embodiment of the invention.

A work holder moving part 1200 that moves the work holder 2000 in the Y-axis direction is installed on a top surface of the stage 1100 at a right side in the X-axis direction.

In this embodiment, the work holder moving part 1200 includes a first linear motor L that is a known component.

The first linear motor L includes a first stator L1, which is installed on the top surface of the stage 1100 and includes a permanent magnet, two first rails L2, which are disposed at both side of the first stator L1 in the X-axis direction, respectively, and installed on the top surface of the stage 1100 to extend in the Y-axis direction, a first mover L3, which is installed above the first rails L2 and in which a coil winding is provided, and a first movable member L4 which is fixed to the first mover L3.

In the first linear motor L, as electric current is applied to the coil winding inside the first mover L3, the first mover L3 moves along the first rails L2 due to interaction with the first stator L1, and accordingly, the first movable member L4 moves.

Figure 5:
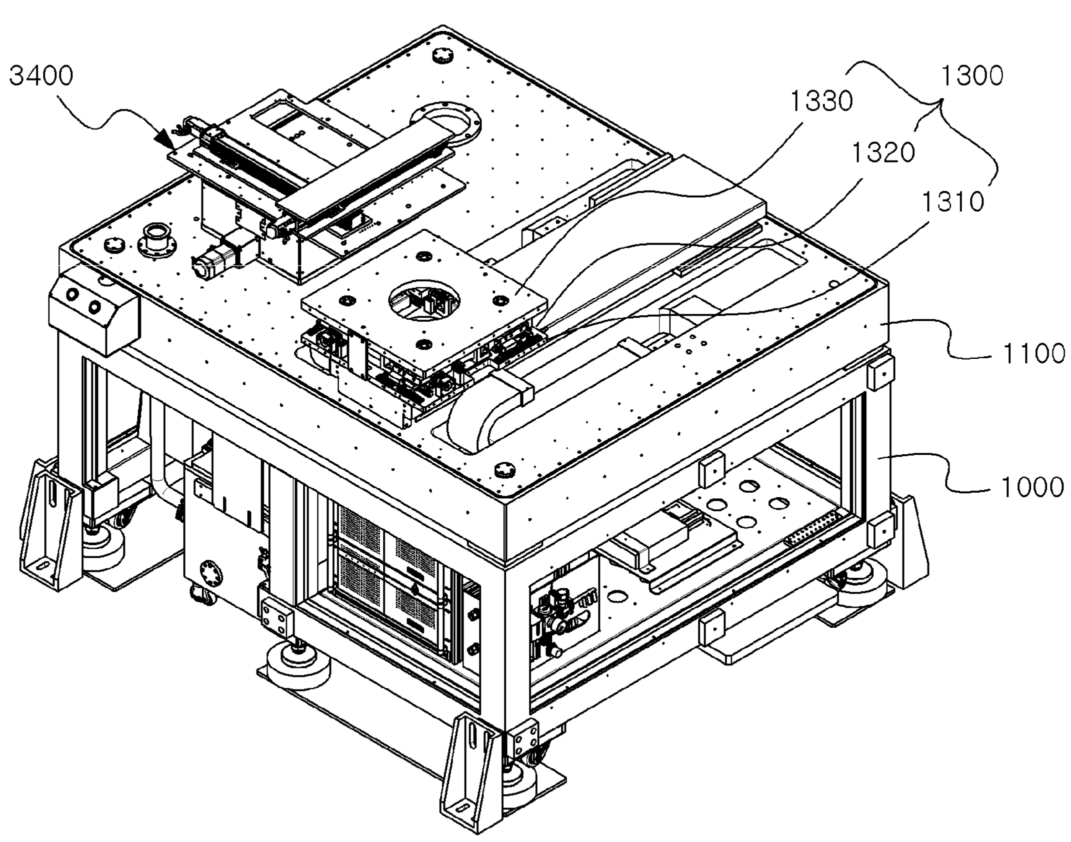
FIG. 5 is a view illustrating a UVW stage according to an embodiment of the invention.

FIG. 5 is a view illustrating a UVW stage according to an embodiment of the invention.

A UVW stage 1300 that is a known component is installed above the work holder moving part 1200.

The UVW stage 1300 includes a lower plate 1310, a UVW stage component 1320 installed on the lower plate 1310 and is a known component, and an upper plate 1330 installed on the UVW stage component 1320.

A work holder bottom member 2001 is fixed onto the upper plate 1330 of the UVW stage 1300 so that the work holder 2000 is installed.

Figure 6:
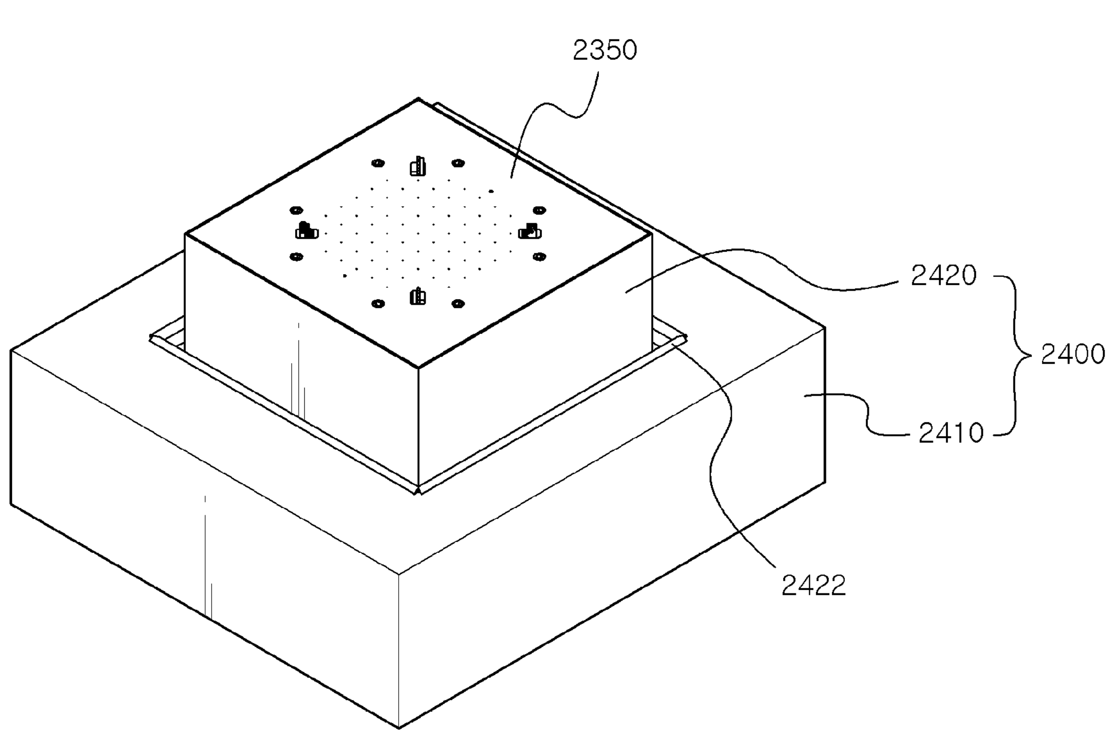
FIG. 6 is a view illustrating the entirety of a work holder according to an embodiment of the invention.
Figure 7:
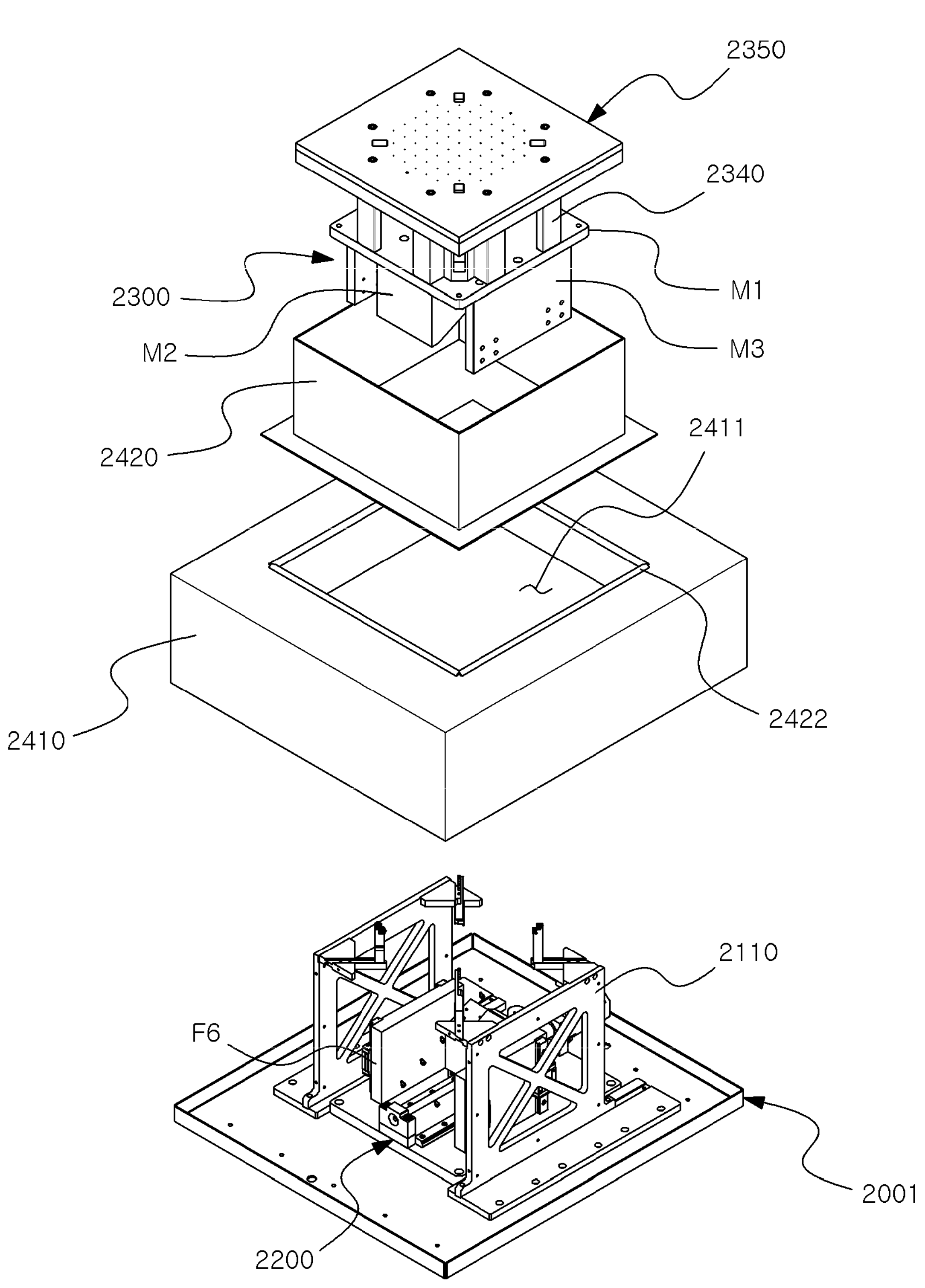
FIG. 7 is an exploded perspective view of a work holder according to an embodiment of the invention.
Figure 8:
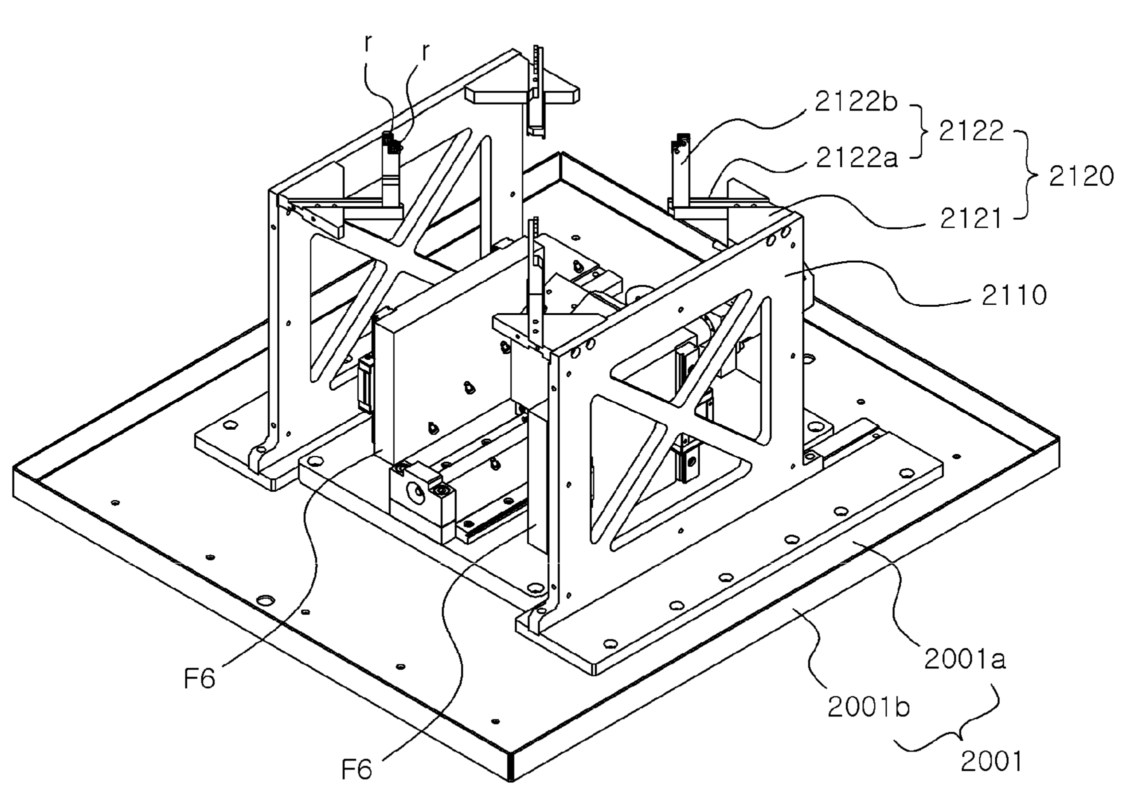
FIG. 8 is a view illustrating a wafer support part of a work holder according to an embodiment of the invention.
Figure 9:
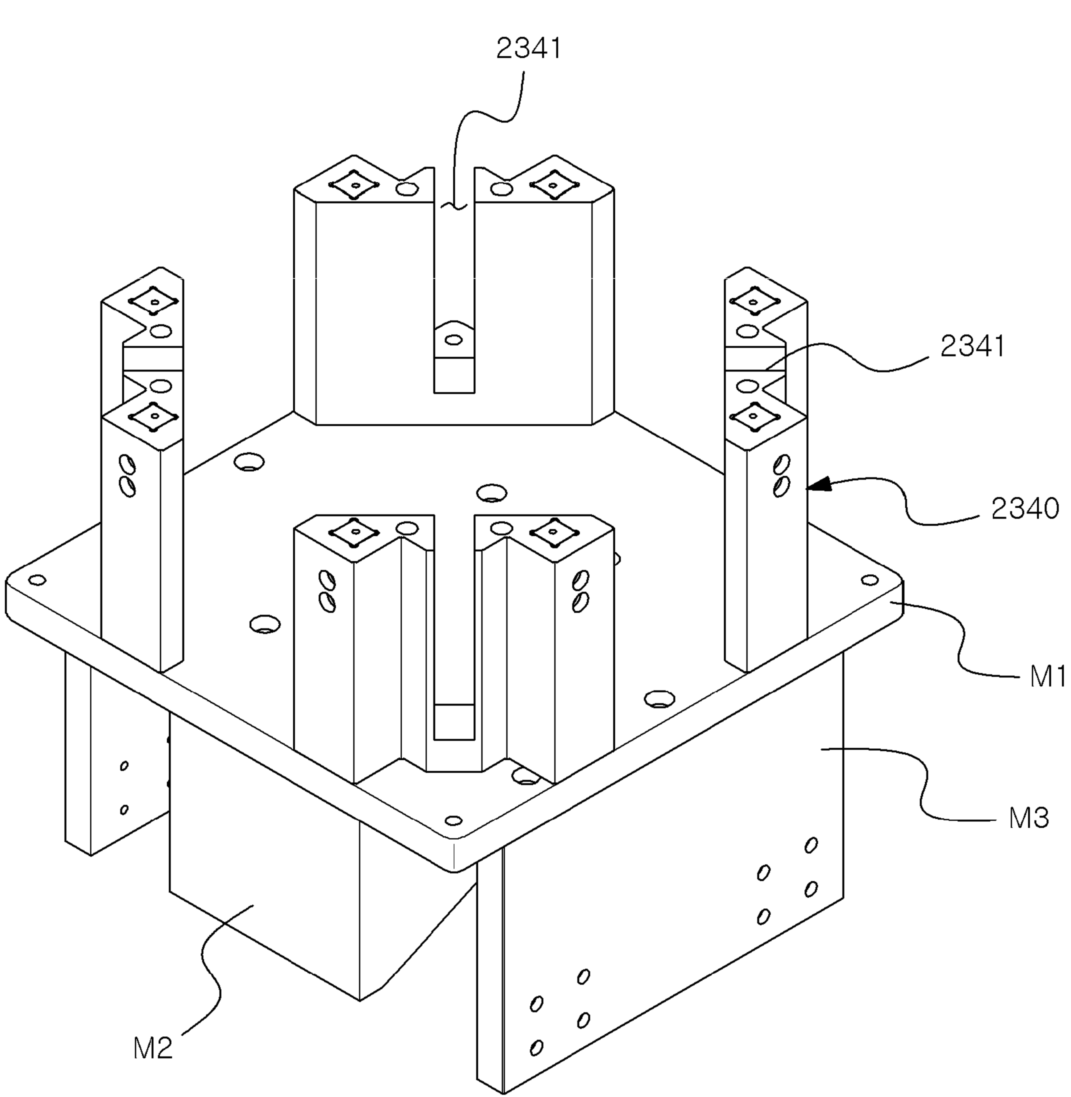
FIG. 9 is a view illustrating a support column of a work holder according to an embodiment of the invention.
Figure 10:
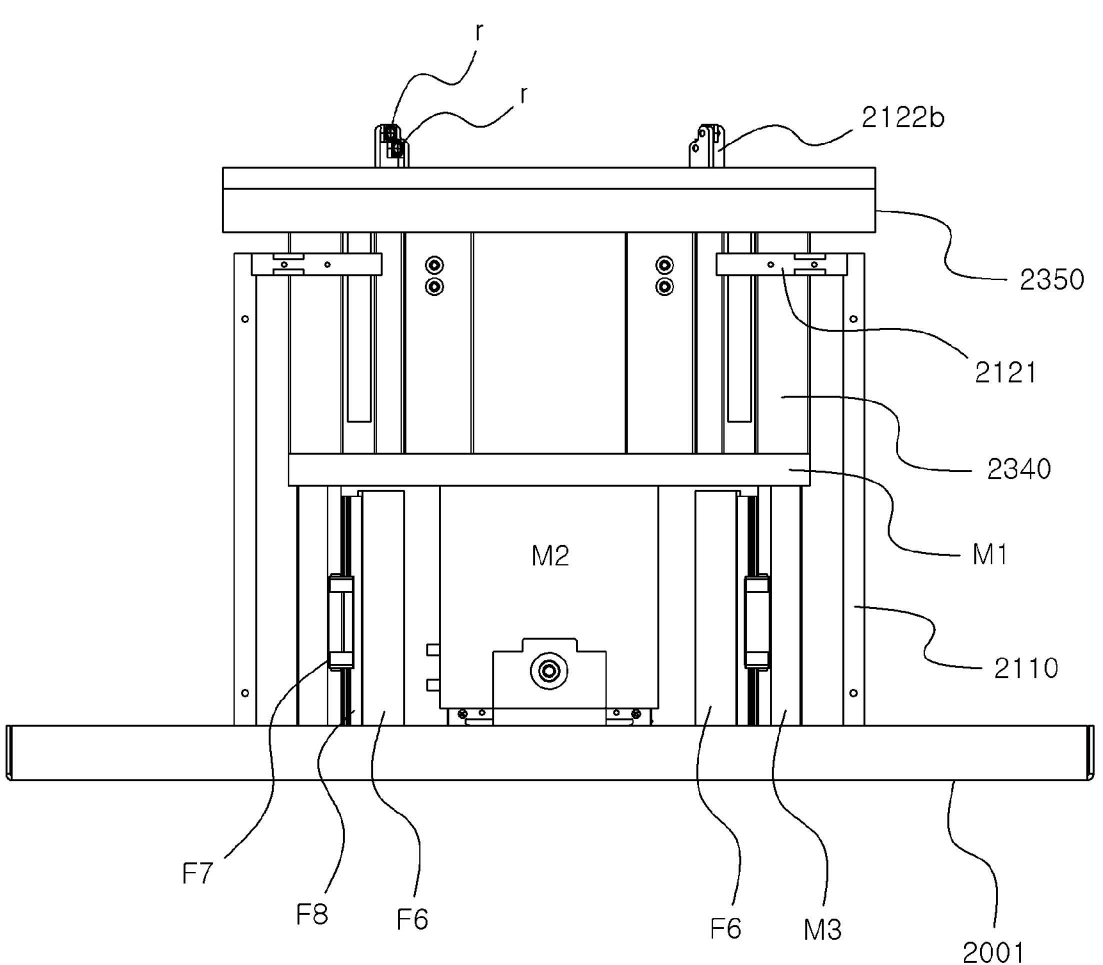
FIG. 10 is a cross-sectional view of a work holder on a YZ plane according to an embodiment of the invention.
Figure 11:
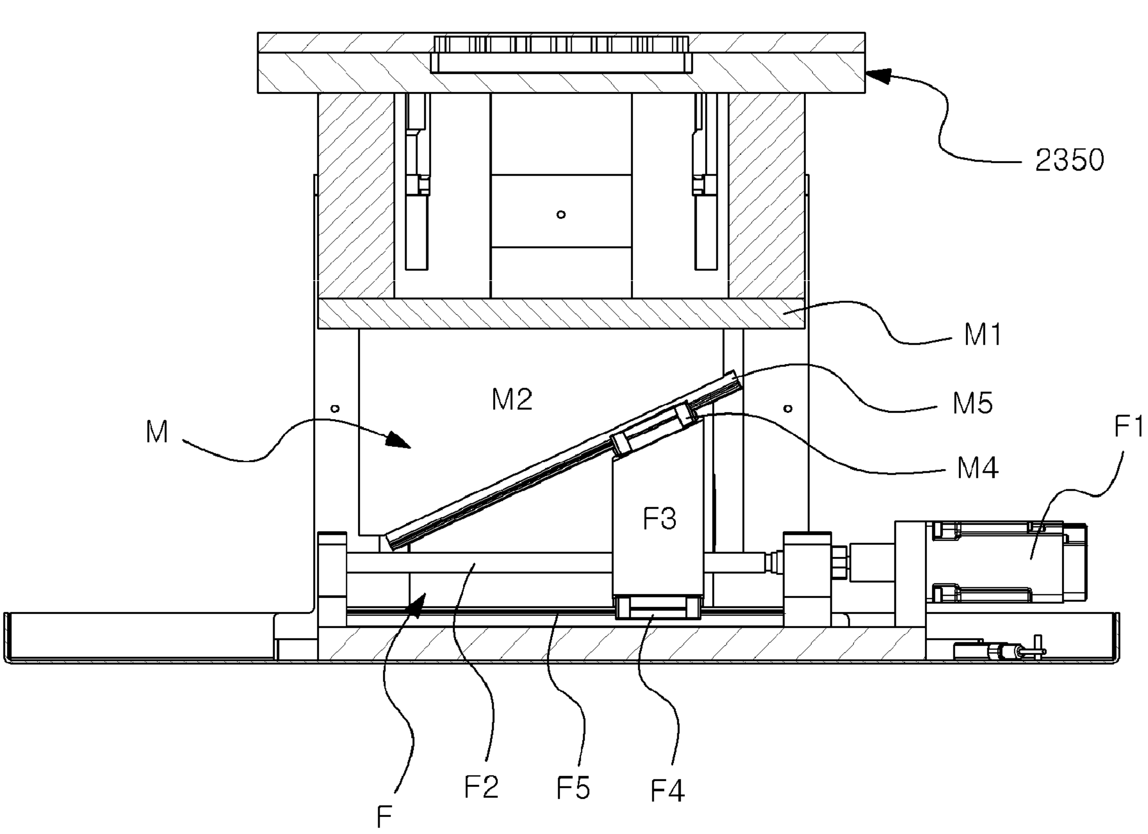
FIG. 11 is a cross-sectional view of a work holder on an XZ plane according to an embodiment of the invention.

FIG. 6 is a view illustrating the entirety of a work holder according to an embodiment of the invention. FIG. 7 is an exploded perspective view of a work holder according to an embodiment of the invention. FIG. 8 is a view illustrating a wafer support part of a work holder according to an embodiment of the invention. FIG. 9 is a view illustrating a support column of a work holder according to an embodiment of the invention. FIG. 10 is a cross-sectional view of a work holder on a YZ plane according to an embodiment of the invention. FIG. 11 is a cross-sectional view of a work holder on a YZ plane according to an embodiment of the invention.

The work holder 2000 includes a wafer support part 2100 fixed to the work holder bottom member 2001, a first upward moving part 2200 installed inside the wafer support part 2100, a work holder body 2300 installed above the first upward moving part 2200, and a work holder cover part 2400 provided to cover the work holder 2000.

The work holder bottom member 2001 is fixed to the first movable member L4 of the work holder moving part 1200.

The work holder bottom member 2001 includes a bottom surface 2001*a* having a flat plate shape, and a cover 2001*b* extending upward from edges of the bottom surface 2001*a* having a flat plate shape.

In the first linear motor L, as electric current is applied to the coil winding inside the first mover L3, the first mover L3 moves along the first rails L2 due to interaction with the first stator L1, and accordingly, the first movable member L4 moves.

The wafer support part 2100 includes a support 2110, which is fixed to the work holder bottom member 2001 and installed to extend upward, and a wafer support member 2120 installed on an upper portion of the support 2110.

The support 2110 includes two plate-shaped members, which are installed on the bottom surface 2001*a* having flat plate shape of the work holder bottom member 2001 so as to be spaced apart from each other in the X-axis direction, and which extend upward.

The wafer support member 2120 includes a horizontal support 2121, which extends from an upper end of the support 2110 to the inside of an XY plane and has a triangular flat plate shape, and a wafer support rod 2122 which extends upward from an end of the horizontal support 2121.

The wafer support rod 2122 includes a horizontal member 2122*a* installed to further extend inward from the horizontal support 2121, and a vertical member 2122*b* provided at an upper side with respect to the horizontal member 2122*a*.

Two rollers r are installed on upper end of the vertical member 2122*b* of the wafer support rod 2122 to have different heights in a Z-axis direction.

The first upward moving part 2200 includes a first upward driving part F, and a first relatively movable part M installed above the first upward driving part F.

The first upward driving part F includes a linearly moving device that is a known component. For example, the first upward driving part F may be provided as a linear motor or in a ball screw type, and in this embodiment, the first upward driving part F is provided in a ball screw type.

The first upward driving part F includes a first ball screw F2, which is installed to extend from the bottom surface 2001*a* having a flat plate shape of the work holder bottom member 2001 in the Y-axis direction and is driven by a first motor F1, and a first inclined block F3 which is linearly moved by the first ball screw F2.

A first lower rail part F5, on which a first lower slider F4 is installed, is installed below the first inclined block F3, and a bottom surface of the first inclined block F3 is fixed to the first lower slider F4.

The first inclined block F3 is provided to be inclined so that a height of a top surface of the first inclined block F3 gradually increases in a Y-axis backward direction.

A first fixing guide part F6 extending in a Z-axis upward direction is installed at each of both sides of the first inclined block F3, and a first side rail F8, which extends in the Z-axis upward direction and on which a first side slider F7 is installed, is provided outside the first fixing guide part F6.

The first relatively movable part M includes a first support plate M1, a first inclined part M2 installed below a center of the first support plate M1, and a first movement guide member M3 installed at each of both sides of the first inclined part M2.

A bottom surface of the first inclined part M2 is provided to be inclined so that the first inclined part M2 has a shape corresponding to a top surface of the first inclined block F3.

A first upper rail M5, on which a first upper slider M4 is installed, is installed on the bottom surface of the first inclined part M2, and the top surface of the first inclined block F3 is fixed to the first upper slider M4.

The first movement guide member M3 has a plate shape and is provided to extend in the Z-axis upward direction, and an inner side the first movement guide member M3 is fixed to the first side slider F7.

The work holder body 2300 includes a support column 2340 extending from an upper portion of the first support plate M1 in the Z-axis upward direction, and a wafer support plate 2350 installed on an upper end of the support column 2340.

The support column 2340 is provided in four, and the four support columns 2340 are installed at corners to correspond to the wafer support rods 2122 provided on the support 2110, respectively.

A position at which the support column 2340 is installed is determined so that when the work holder body 2300 moves in the Z-axis direction, an interference of the horizontal support 2121 does not occur.

A support rod guide groove 2341, which extends in the Z-axis direction so that when the work holder body 2300 moves in the Z-axis direction, the wafer support rod 2122 is guided, is defined in an inner side of the support column 2340.

Figure 12:
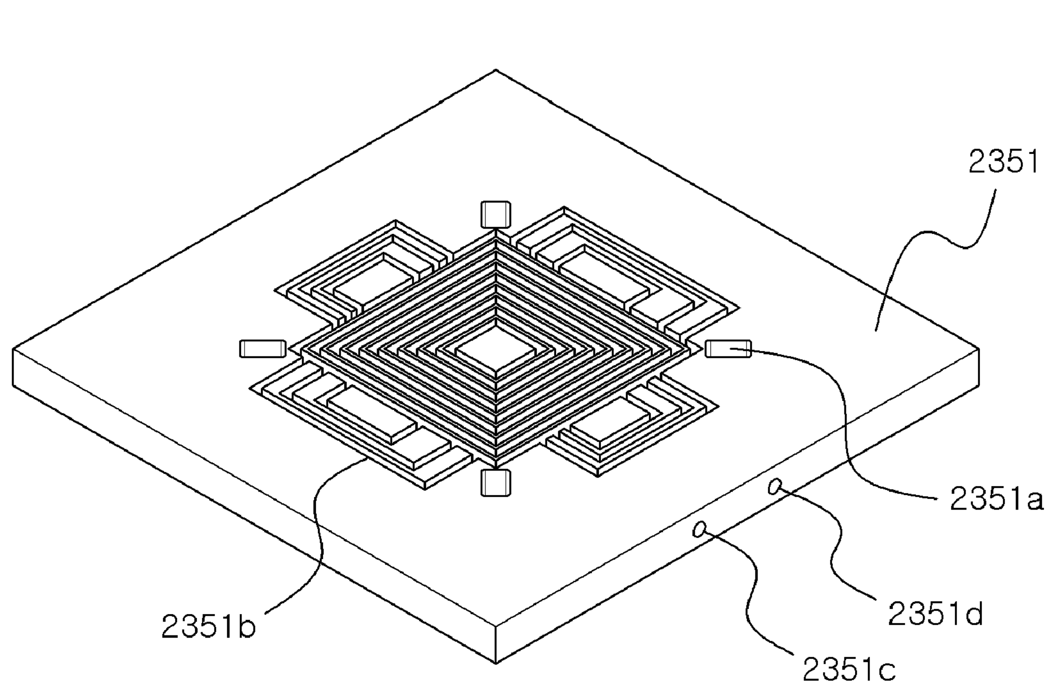
FIG. 12 is a view illustrating a cooling plate according to an embodiment of the invention.
Figure 13:
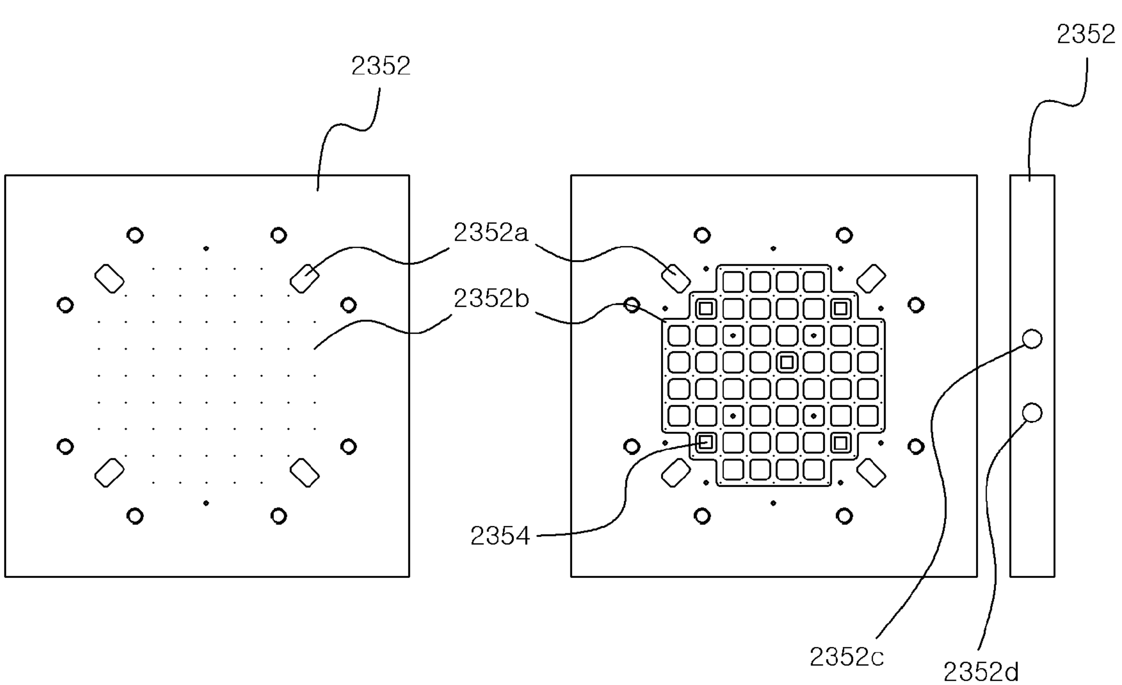
FIG. 13 is a view illustrating a wafer support plate according to an embodiment of the invention.
Figure 14:
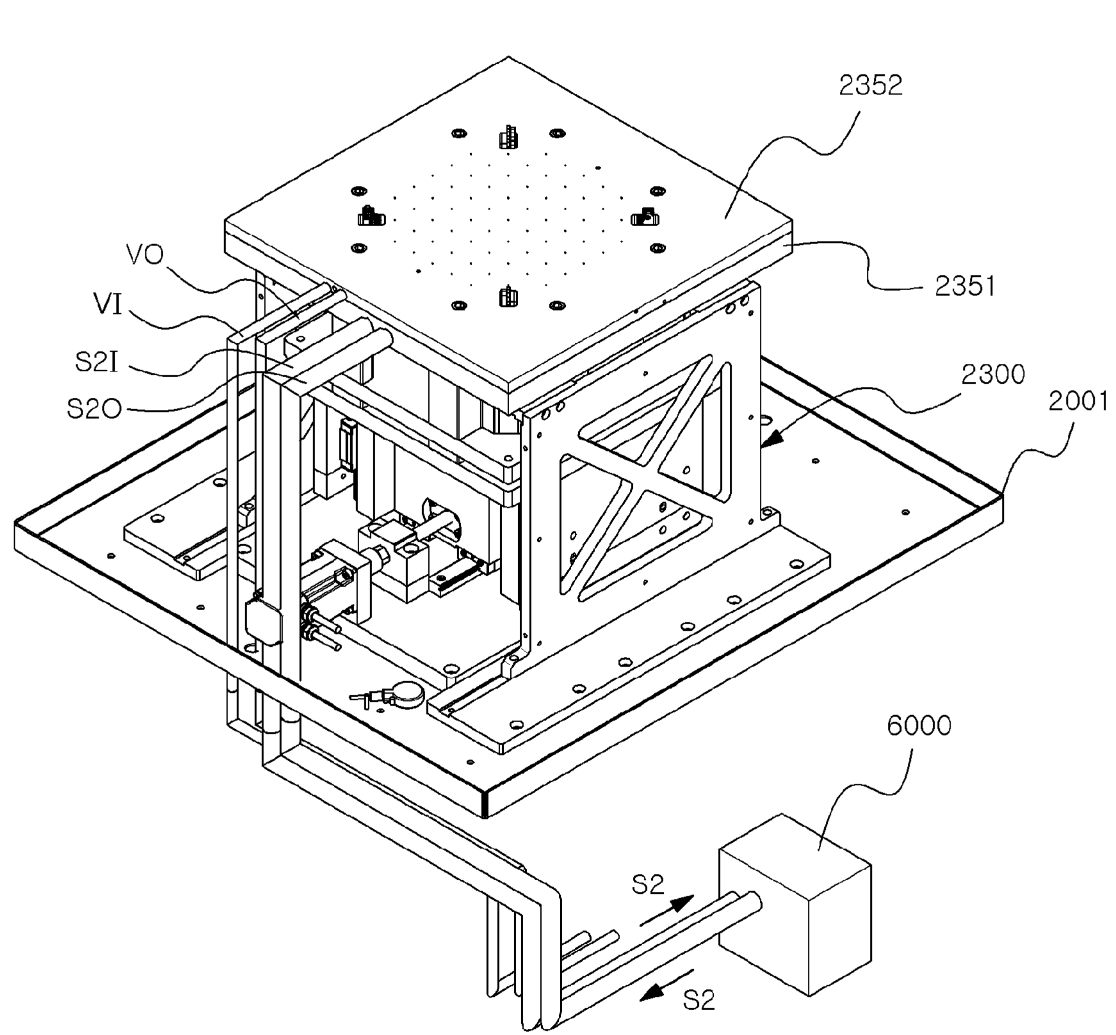
FIG. 14 is a view illustrating a connection pipe of a wafer support plate according to an embodiment of the invention.
Figure 15:
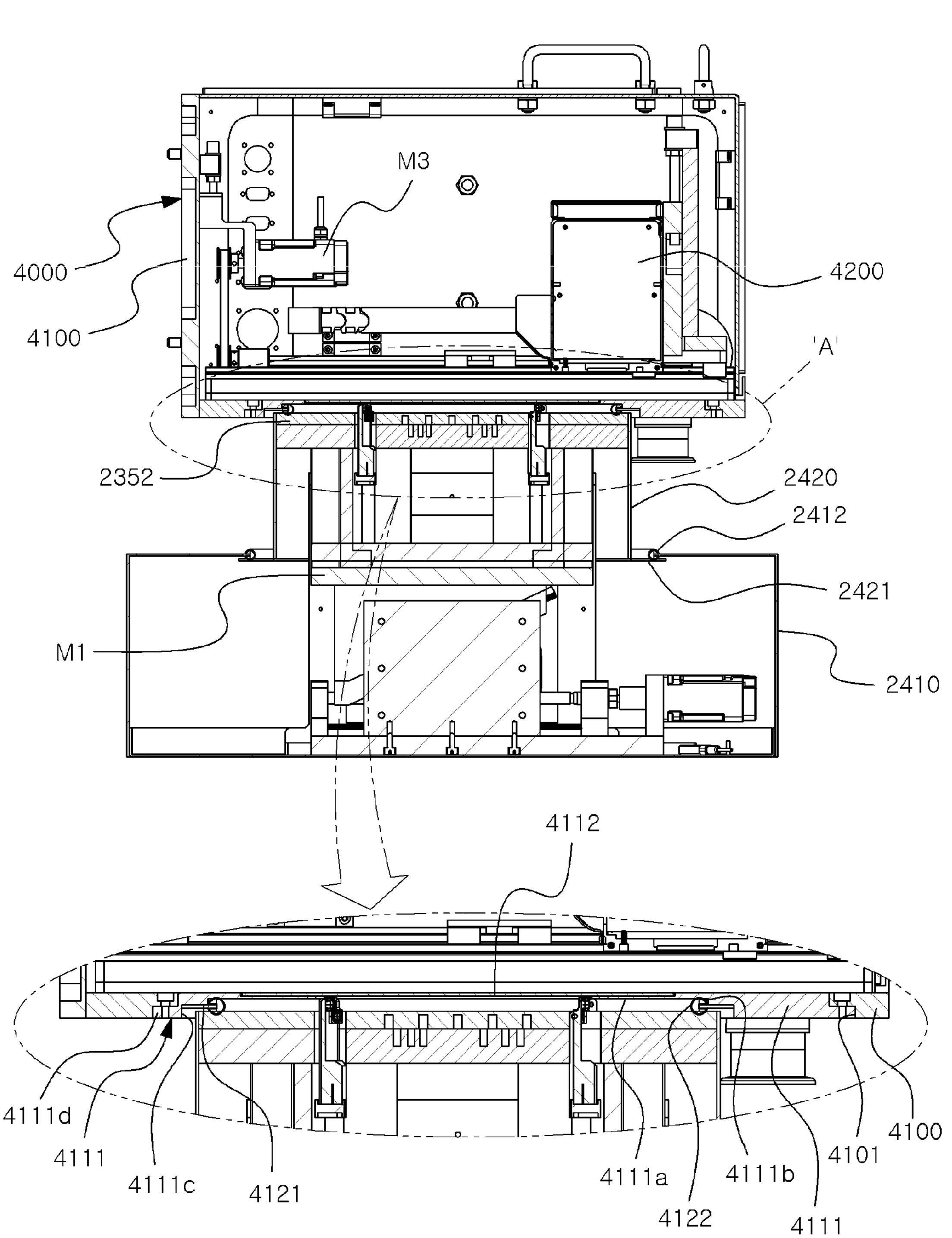
FIG. 15 is a cross-sectional view of a state in which a work holder ascends to be in contact with a curing device on an XZ plane according to an embodiment of the invention.

FIG. 12 is a view illustrating a cooling plate according to an embodiment of the invention. FIG. 13 is a view illustrating a wafer support plate according to an embodiment of the invention. FIG. 14 is a view illustrating a connection pipe of a wafer support plate according to an embodiment of the invention.

The wafer support plate 2350 includes a cooling plate 2351 installed on a lower portion thereof, and a wafer fixing plate 2352 installed above the cooling plate 2351.

A guide groove 2351*a* is defined in an edge of the cooling plate 2351 so that the wafer support rod 2122 is movable in the Z-axis direction, a passage 2351*b* through which a first cooling fluid S1 flows is defined at a center of the cooling plate 2351, and an inlet 2351*c* and an outlet 2351*d* which communicate with the passage 2351*b* are defined in a side surface of the cooling plate 2351.

The inlet 2351*c* and the outlet 2351*d* are connected to one end of a cooling water inflow pipe S2I and one end of a cooling water outflow pipe S2O, respectively.

In the invention, the first cooling fluid S1 is provided to continuously flow inside the cooling plate 2351.

Each of the other end of the cooling water inflow pipe S2I and the other end of a cooling water outflow pipe S2O is connected to a chiller 6000, and the chiller 6000 serves to control a temperature of the first cooling fluid S1.

A guide groove 2352*a* is also defined in the wafer fixing plate 2352 so that the wafer support rod 2122 is movable in the Z-axis direction, a vacuum adsorption hole 2352*b* through which the wafer is fixed is defined at a center of the wafer fixing plate 2352, and a vacuum suction hole 2352*c* and a vacuum discharge hole 2352*d* which communicate with the vacuum adsorption hole 2352*b* are defined in a side surface of the wafer fixing plate 2352.

The vacuum suction hole 2352*c* and the vacuum discharge hole 2352*d* are connected to a vacuum inflow pipe VI and a vacuum discharge pipe VO, respectively.

A plurality of temperature sensors 2354 is installed on a bottom surface of the wafer fixing plate 2352.

The work holder cover part 2400 includes a first cover part 2410 and a second cover part 2420.

The first cover part 2410 may have a rectangular box shape as a whole, and has a lower portion that is opened to be fixed while covering the cover 2001*b* of the work holder bottom member 2001.

A lateral portion of the first cover part 2410 may be provided to cover the wafer support part 2100, the first upward moving part 2200, and a lower portion of a first support plate 2310 of the work holder body 2300.

An opened groove 2411, which has a rectangular shape and an upper portion that is opened so that the work holder body 2300 is movable in the Z-axis direction, is defined in an upper portion of the first cover part 2410, and a first sealing 2412 is installed along an inner perimeter of the opened groove 2411.

The opened groove 2411 is provided to have a size to allow the work holder body 2300, on which the second cover part 2420 is mounted, to move upward.

The second cover part 2420 may also have a rectangular box shape as a whole, and an opened portion 2411 is defined so that upper and lower portions of the second cover part 2420 are opened. The work holder body 2300 is inserted into the opened portion 2411.

The upper portion of the second cover part 2420 is fixed to the wafer support plate 2350 so that when the work holder body 2300 moves in the Z-axis direction, the second cover part 2420 moves together.

A first flange 2421 having a flat plate shape is provided along a lower perimeter of the second cover part 2420 so as to be in contact with the first sealing 2412 when the work holder body 2300 moves upward.

Figure 16:
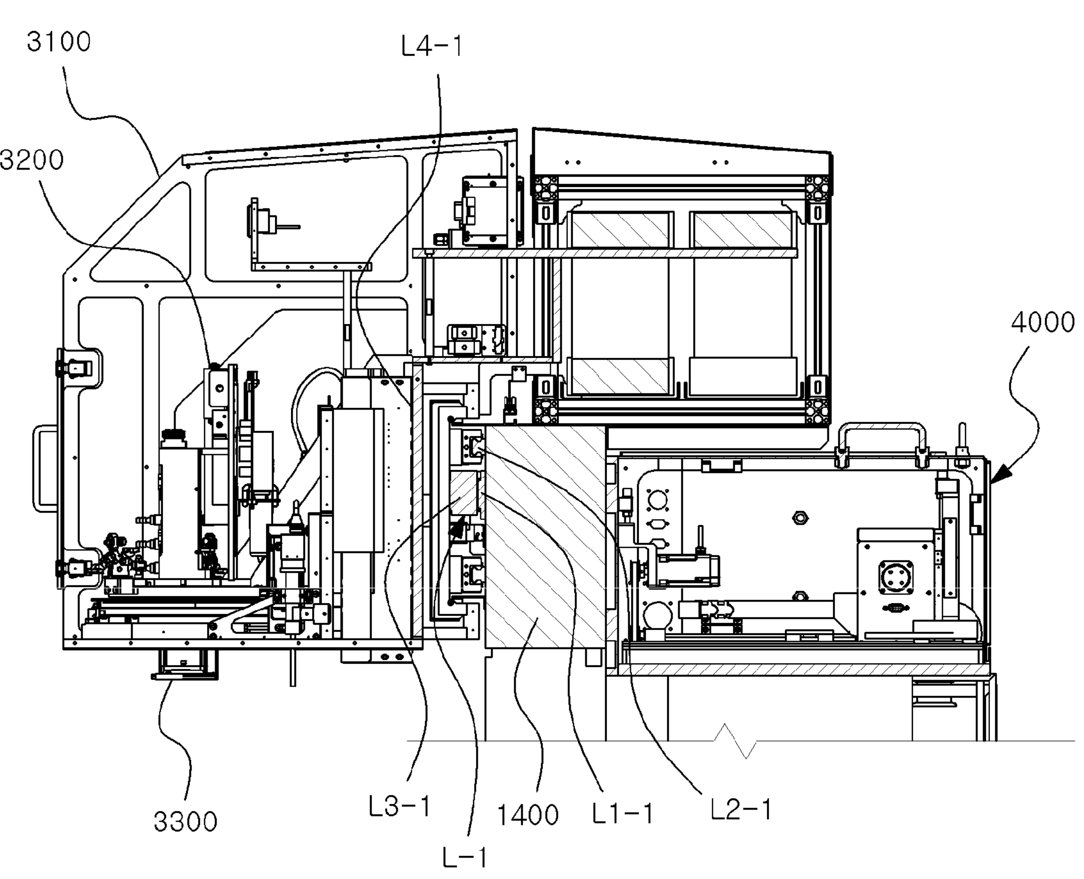
FIG. 16 is a cross-sectional view illustrating a head part moving part on a YZ plane according to an embodiment of the invention.

FIG. 16 is a cross-sectional view illustrating a head part moving part on a YZ plane according to an embodiment of the invention.

Head part supports 1300 are installed above the stage 1100 to be spaced apart from each other in the X-axis direction at an upper side in the Z-axis direction, and a head part moving part 1400 that transfers the head part 3000 in the X-axis direction is installed on the head part supports 1300.

Like the work holder moving part 1200, the head part moving part 1400 includes a second linear motor L-1 that is a known component.

The second linear motor L-1 includes a second stator L1-1, which is installed on the top surface of the stage 1100 and includes a permanent magnet, two second rails L2-1, which are disposed at both side of the second stator L1-1 in the X-axis direction, respectively, and installed on the top surface of the stage 1100 to extend in the Y axis direction, a second mover L3-1, which is installed above the second rails L2-1 and in which a coil winding is provided, and a second movable member L4-1 which is fixed to the second mover L3-1.

In the second linear motor L, as electric current is applied to the coil winding inside the second mover L3-1, the second mover L3-2 moves along the second rails L2-1 due to interaction with the second stator L1-1, and accordingly, the second movable member L4-1 moves.

The head part 3000 includes a chamber 3100, a head driving part 3200 installed inside the chamber 3100, and a head 3300 installed below the head driving part 3200 and driven by the head driving part 3200.

The chamber 3100 is defined so that the head driving part 3200 is installed and sealed in the chamber 3100. The chamber 3100 has a lower portion, from which the head 3300 protrudes downward, and a rear surface which is fixed to the second movable member L4-1 of the head part moving part 1400.

In an embodiment of the invention, the chamber 3100 is defined so that the chamber 3100 moves only in the X-axis direction, and does not move in the Z-axis direction. Thus, the head 3300 also moves only in the X-axis direction, and does not move in the Z-axis direction.

Figure 17:
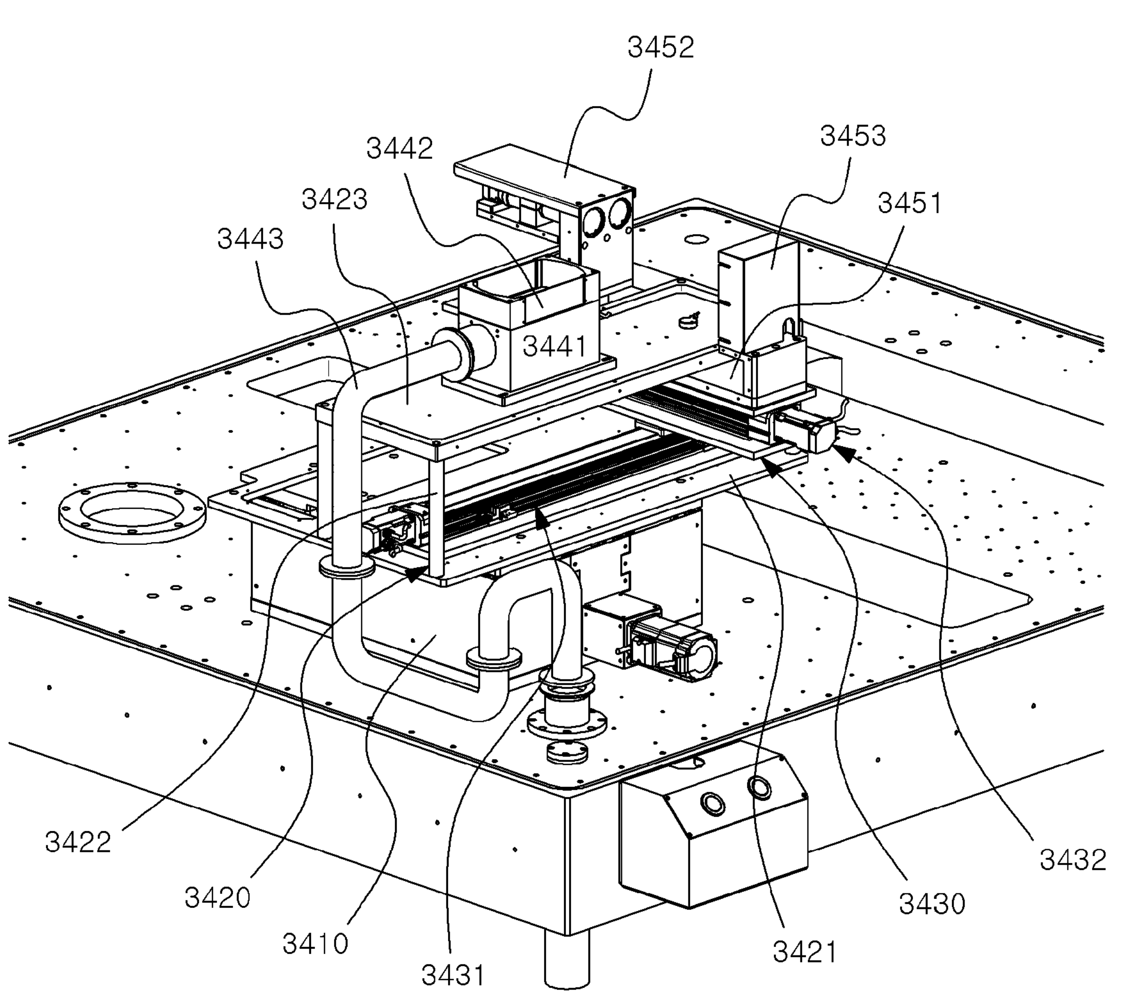
FIG. 17 is a perspective view illustrating a head inspecting part according to an embodiment of the invention.
Figure 18:
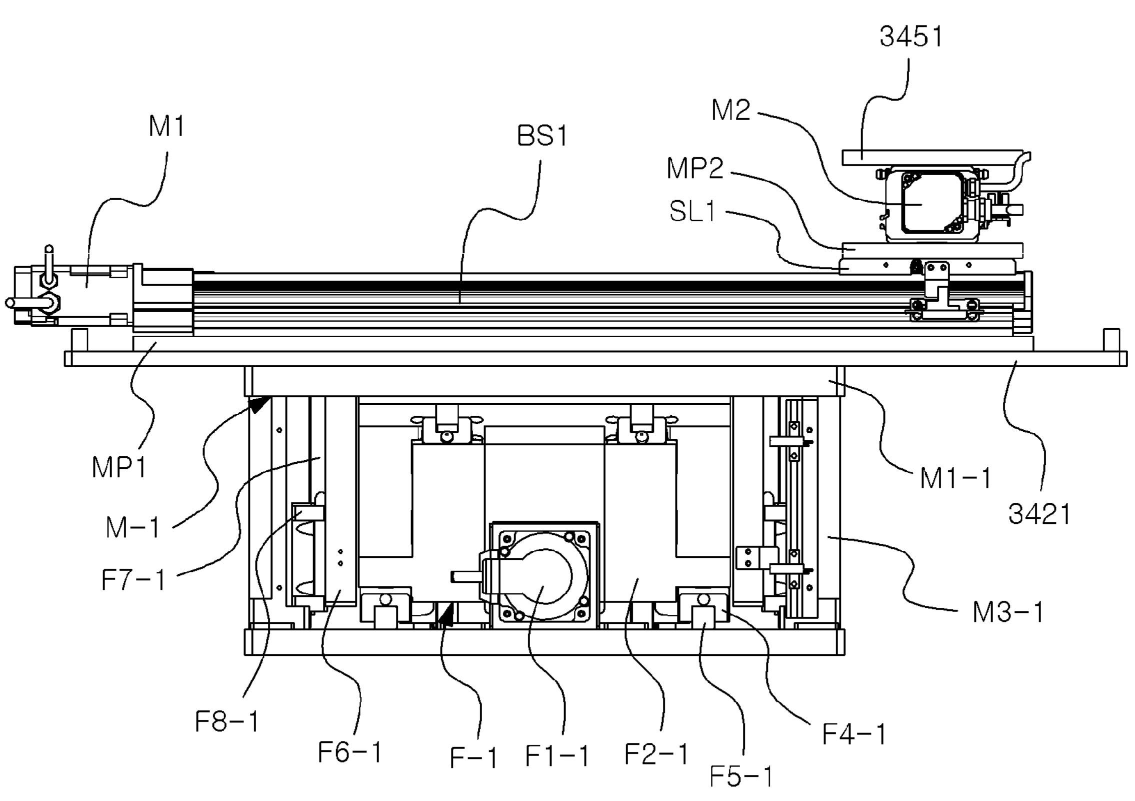
FIG. 18 is a cross-sectional view illustrating a head inspecting part on a YZ plane according to an embodiment of the invention.
Figure 19:
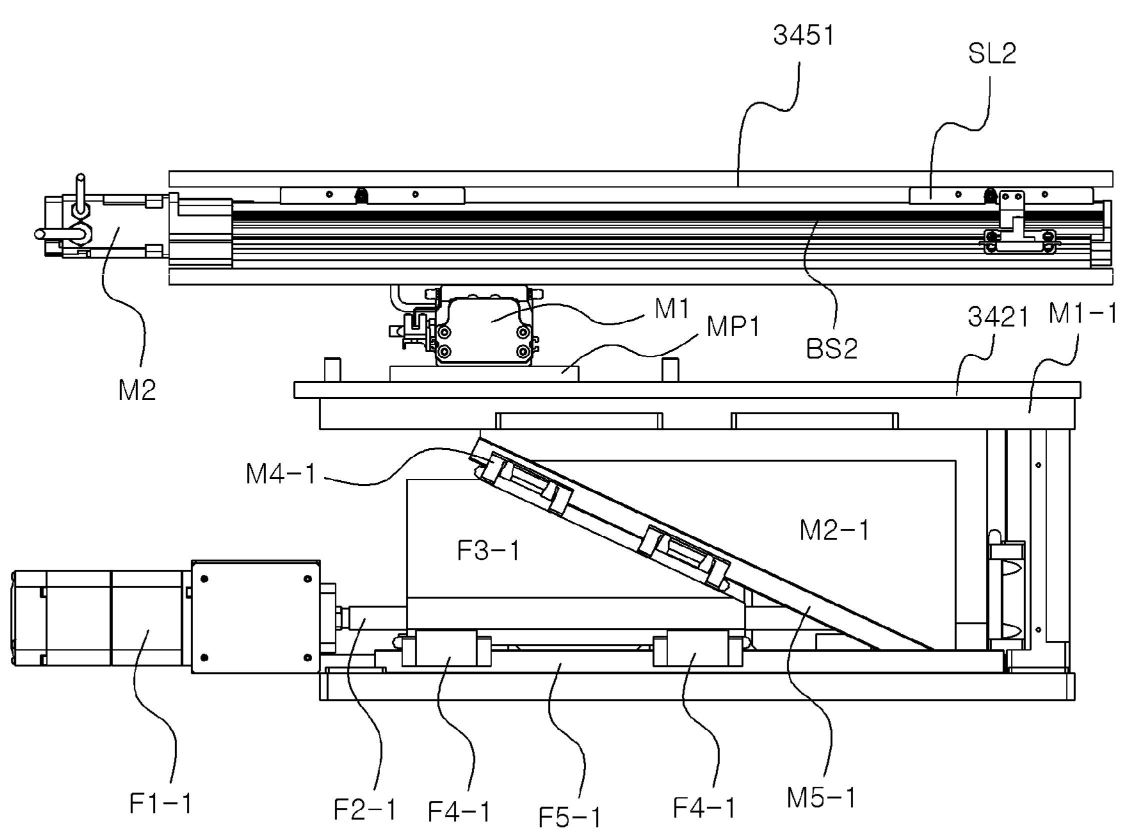
FIG. 19 is a cross-sectional view illustrating a head inspecting part on an XZ plane according to an embodiment of the invention.

FIG. 17 is a perspective view illustrating a head inspecting part according to an embodiment of the invention. FIG. 18 is a cross-sectional view illustrating a head inspecting part on a YZ plane according to an embodiment of the invention. FIG. 19 is a cross-sectional view illustrating a head inspecting part on an XZ plane according to an embodiment of the invention.

A head inspecting part 3400 is installed below the head part 3000.

The head inspecting part 3400 includes a second upward moving part 3410, a purging cup support part 3420 installed above the second upward moving part 3410, an inspecting part moving part 3430 installed on a bottom surface of the purging cup support part 3420, a purging cup 3440 installed above the purging cup support part 3420, an inspecting part 3450 installed on the inspecting part moving part 3430 of the purging cup support part 3420.

The second upward moving part 3410 is fundamentally provided in a manner substantially similar to the first upward moving part 2200 except that a ball screw is installed in the X-axis direction, when compared to the first upward moving part 2200 in which the ball screw is installed in the Y-axis direction.

The second upward moving part 3410 includes a second upward driving part F-1, and a second relatively movable part M-1 installed above the second upward driving part F-1.

Like the first upward driving part F, the second upward driving part F-1 includes a linearly moving device that is a known component. For example, the second upward driving part F-1 may be provided as a linear motor or in a ball screw type. In this embodiment, the second upward driving part F-1 is provided in a ball screw type.

The second upward driving part F-1 includes a second ball screw F2-1 which is installed on the stage 1100 and driven by a second motor F1-1, and a second inclined block F3-1 which is linearly moved by the second ball screw F2-1.

A second lower rail part F5-1, on which a second lower slider F4-1 is installed, is installed below the second inclined block F3-1, and a bottom surface of the second inclined block F3-1 is fixed to the second lower slider F4.

The second inclined block F3-1 is provided to be inclined so that a height of a top surface of the second inclined block F3 gradually increases toward the Y-axis backward direction.

A second fixing guide part F6-1 extending in the Z-axis upward direction is installed at each of both sides of the second inclined block F3-1, and a second side rail F8-1, which extends in the Z-axis upward direction and on which a second side slider F7-1 is installed, is provided outside the second fixing guide part F6-1.

The second relatively movable part M-1 includes a second support plate M1-1, a second inclined part M2 installed below at a center of the second support plate M1-1, and a second movement guide member M3-1 installed at each of both sides of the second inclined part M2.

A bottom surface of the second inclined part M2-1 is provided to be inclined so that the second inclined part M2-1 has a shape corresponding to a top surface of the second inclined block F3-1.

A second upper rail M5-1, on which a second upper slider M4-1 is installed, is installed on the bottom surface of the second inclined part M2-1, and the top surface of the second inclined block F3-1 is fixed to the second upper slider M4-1.

The second movement guide member M3-1 has a plate shape and is provided to extend in the Z-axis upward direction, and an inner side of the second M guide member M3-1 is fixed to the second side slider F7-1.

The purging cup support part 3420 includes a first horizontal support part 3421 fixed to the second support plate M1-1 and having a flat plate shape, a vertical support part 3422 extending vertically from the first horizontal support part 3421, and a second horizontal support part 3423 fixed to the vertical support part 3422 and having a flat plate shape.

The inspecting part moving part 3430 includes an X-axis directional movement unit 3431 fixed to the first horizontal support part 3421, and a Y-axis directional movement unit 3432 installed to cross the X-axis directional movement unit 3431.

Each of the X-axis directional movement unit 3431 and the Y-axis directional movement unit 3432 is provided in a known ball screw type.

The X-axis directional movement unit 3431 includes a first installation plate MP1 installed on the first horizontal support part 3421, a first ball screw BS1 installed on the first installation plate MP1 and driven by a first motor M1, and a first slider SL1 connected to the first ball screw BS1.

The Y-axis directional movement unit 3432 includes a second installation plate MP2 installed on the first slider SL1, a second ball screw BS2 installed on the second installation plate MP2 and driven by a second motor M2, and a second slider SL2 connected to the second ball screw BS2.

The purging cup 3440 includes a case 3441 installed on the second horizontal support part 3423, a transparent part 3442 installed above the case 3441, and a discharge passage 3443 which is installed on the case 3441 and through which the sprayed ink is discharged.

The transparent part 3442 is provided to be coated with an ultraviolet blocking material or an ultraviolet blocking film so that ultraviolet light by the curing device is blocked.

The inspecting part 3450 is provided as a camera inspection equipment that is a known component.

The inspecting part 3450 includes an inspecting part installation plate 3451 installed on the second slider SL2 and provided to extend in the Y-axis direction, an illuminator 3452 installed on an end of the inspecting part installation plate 3451 in the Y-axis backward direction, and a camera part 3453 installed on an end of the inspecting part installation plate 3451 in a Y-axis forward direction to oppose the illuminator 3452.

The illuminator 3452 and the camera part 3453 are installed to be spaced a certain distance from the purging cup 3440 in each of the X-axis and Y-axis directions to avoid an interference with the purging cup 3440 when each of the illuminator 3452 and the camera part 3453 is moved by the X-axis directional movement unit 3431 and the Y-axis directional movement unit 3432 in the X axis and Y axis directions, respectively.

A nitrogen gas present in the purging cup 3440 of the inspecting part 3450 is discharged through the discharge passage 3443, and passes through the cleaning filter part 1010 provided in the base 1000 to be purged. Then, the nitrogen gas is introduced through a connection pipe 5131 and a circulation passage 5130 again.

Figure 20:
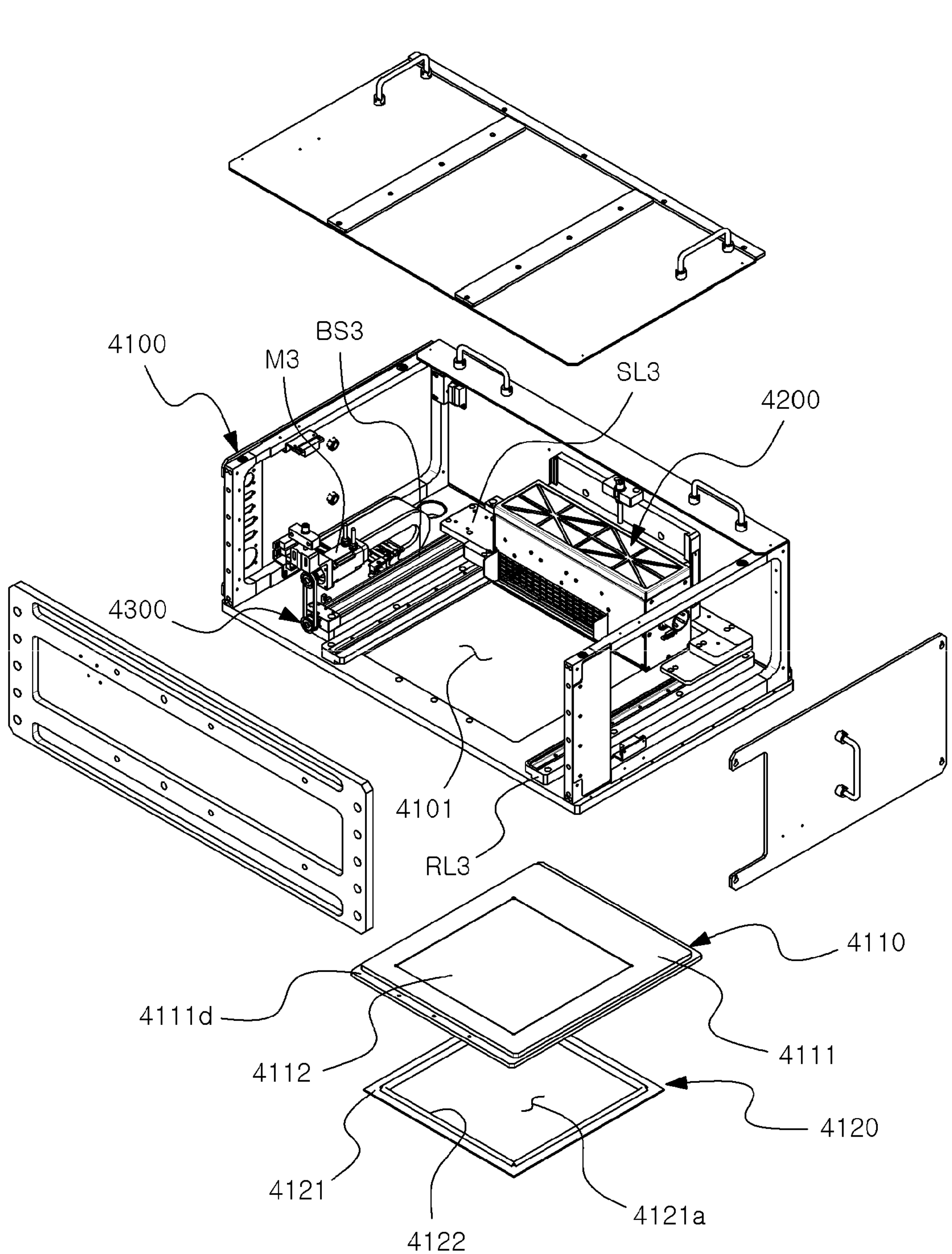
FIG. 20 is an exploded perspective view illustrating a curing device according to an embodiment of the invention.

FIG. 20 is an exploded perspective view illustrating a curing device according to an embodiment of the invention.

The ink curing part 4000 includes a case 4100, a curing device 4200 installed inside the case 4100, and a curing device moving part 4300 that linearly moves the curing device 4200.

The case 4100 has a rectangular box shape, and is provided so that the curing device 4200 and the curing device moving part 4300 are installed inside the case 4100.

An opened groove 4101 having a rectangular shape penetrated downward is defined in a bottom surface of the case 4100, and the opened groove 4101 is provided to be stepped downward.

A glass plate fixing member 4110 is installed below the stepped opened groove 4101.

The glass plate fixing member 4110 includes a frame 4111 provided to be stepped to have a shape corresponding to the stepped opened groove 4101, and a glass plate 4112 installed at a center of the frame 4111.

An extension 4111*a* extending inward to support the glass plate 4112 is provided on an upper portion of the frame 4111, a first stepped groove 4111*b* is defined along an inner perimeter of the frame 4111, and a second stepped groove 4111*c* having a greater width is defined below the first stepped groove 4111*b*.

A second flange 4111*d* having a shape corresponding to the stepped opened groove 4101 is provided along an outer lower perimeter of the frame 4111.

A sealing member 4120 fixed to a lower portion of the glass plate fixing member 4110 includes a frame member 4121 in which a through-groove 4121*a* is defined in a center thereof, and a second sealing 4122 provided along an inner perimeter of the through-groove 4121*a*.

An ultraviolet curing device that is a known component is used as the curing device 4200.

The curing device moving part 4300 is provided using a ball screw device that is a known component.

The curing device moving part 4300 includes a third ball screw BS3 which is installed on a bottom surface of the case 4100 and driven by a third motor M3, a third slider SL3 which is connected to the third ball screw BS3 and has an upper portion on which the curing device 4200 is installed, and a third rail RL3 which is installed at each of both sides of the glass plate 4112 to support the third slider SL3.

Figure 21:
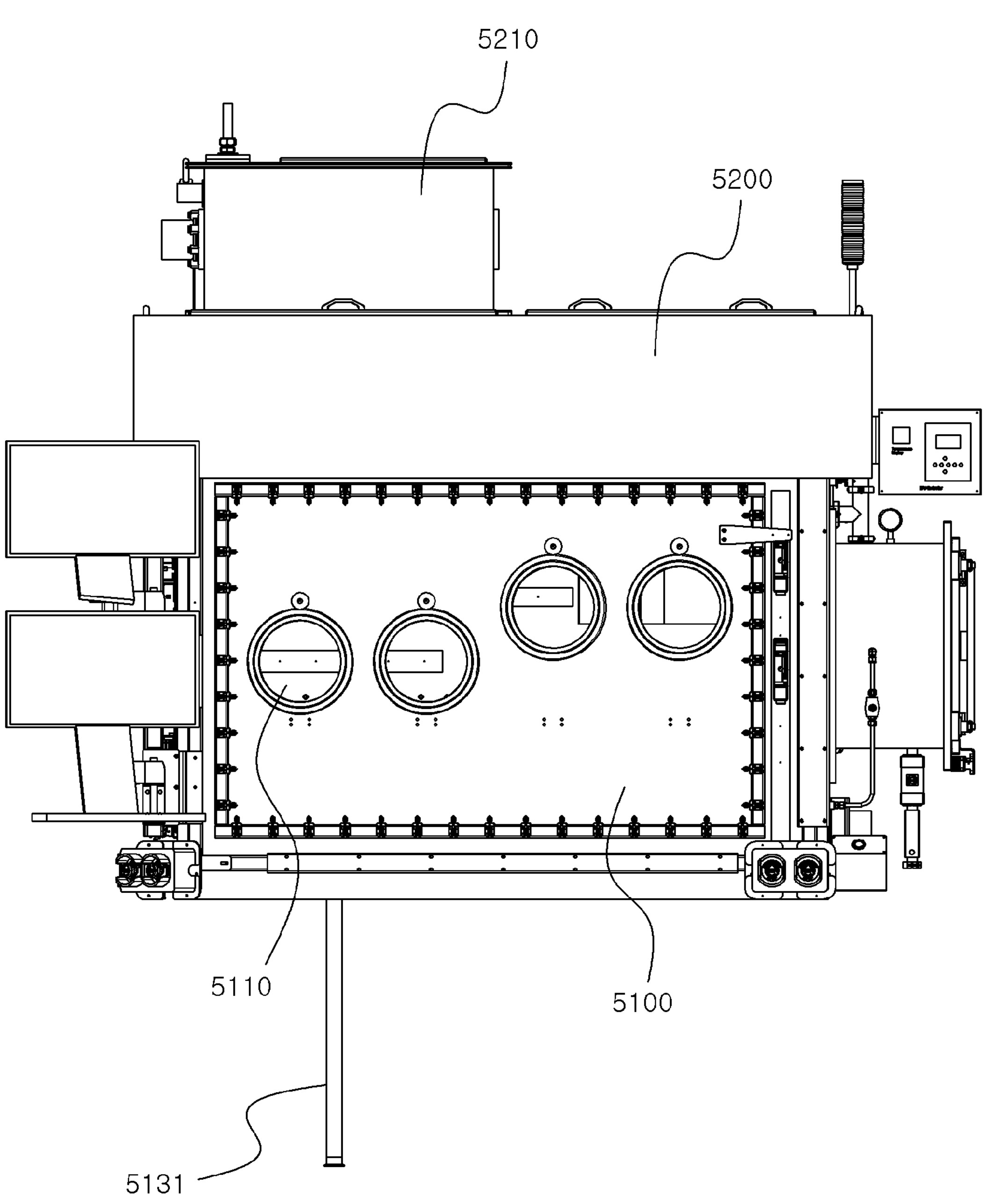
FIG. 21 is a front view illustrating an enclosure according to an embodiment of the invention.
Figure 22:
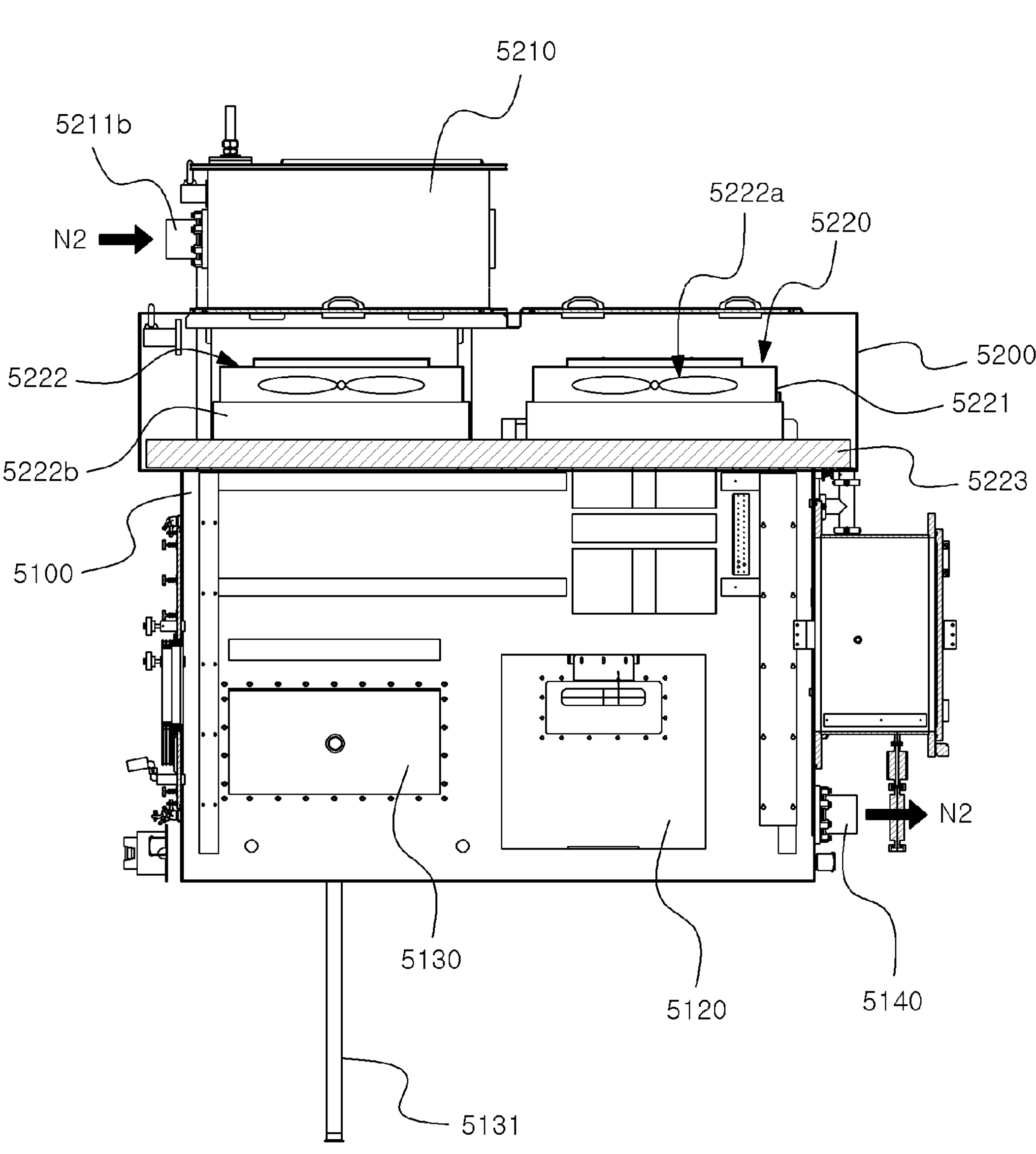
FIG. 22 is a cross-sectional view illustrating an enclosure on an XZ plane according to an embodiment of the invention.
Figure 23:
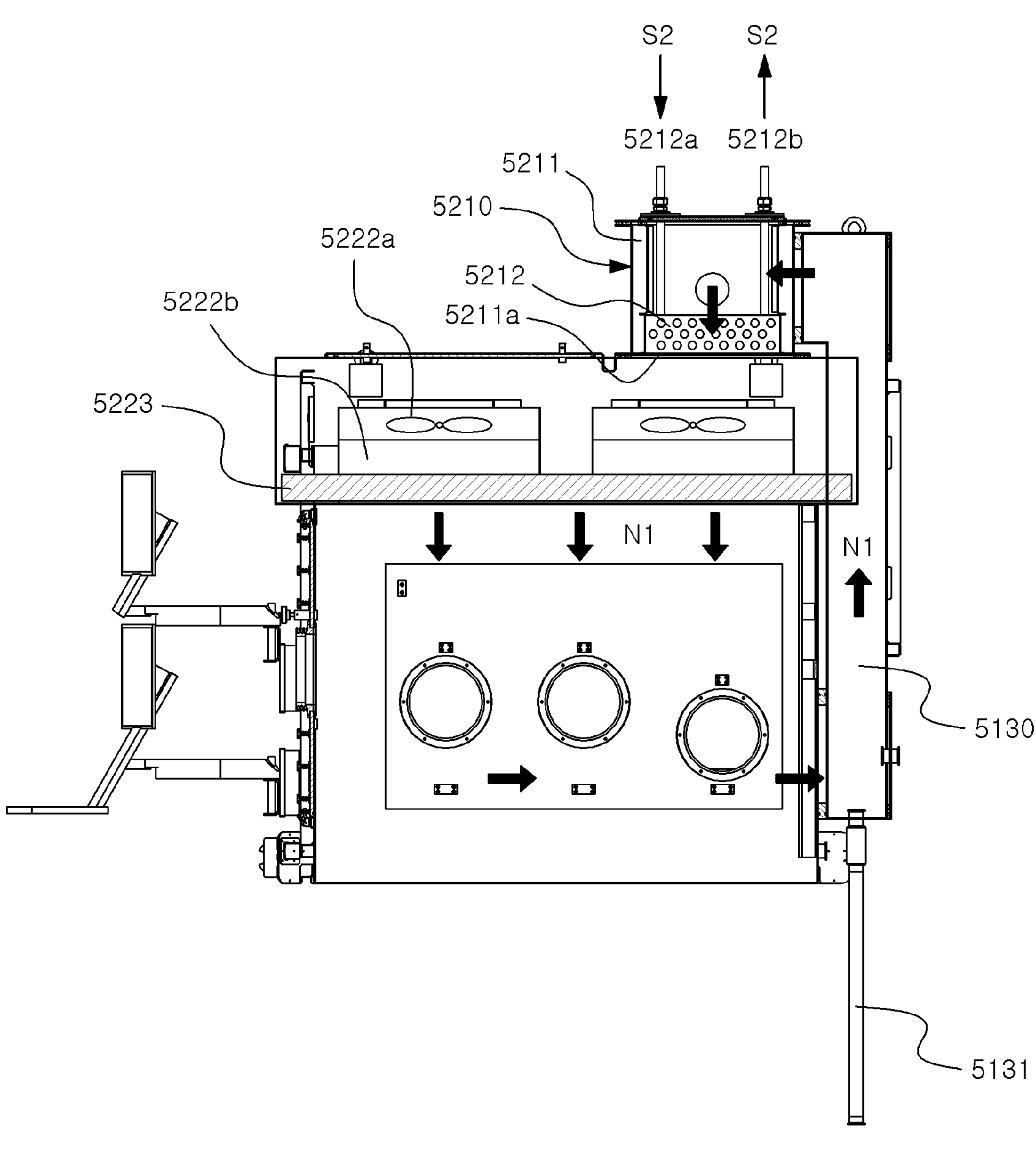
FIG. 23 is a cross-sectional view illustrating an enclosure on a YZ plane according to an embodiment of the invention.

FIG. 21 is a front view illustrating an enclosure according to an embodiment of the invention. FIG. 22 is a cross-sectional view illustrating an enclosure on an XZ plane according to an embodiment of the invention. FIG. 23 is a cross-sectional view illustrating an enclosure on an YZ plane according to an embodiment of the invention.

The enclosure 5000 includes an enclosure box 5100, and a circulator 5200 installed above the enclosure box 5100.

The enclosure box 5100 has a rectangular box shape in which a lower portion thereof is opened as a whole.

A glove box 5110 in which rubber gloves for maintenance and repairs of the inkjet printing equipment are installed is defined in each of a front surface and a side surface of the enclosure box 5100.

A wafer inlet 5120 into which the wafer is inserted in the Y-axis direction is defined in one side of a rear surface of the enclosure box 5100.

In the other side of the rear surface of the enclosure box 5100, a circulation inlet 5131 is defined, and a circulation passage 5130 which communicates with the circulation inlet 5131 and extends in the Z-axis direction is defined.

A supplemental nitrogen gas discharge port 5140 through which a supplemental nitrogen gas is discharged is defined in a right side surface of the enclosure box 5100.

A sealing groove, into which the base sealing member 1120 is inserted, is defined in a bottom surface of the enclosure box 5100 to be installed so that a sealing with the stage 1100 is maintained by the base sealing member 1120.

The circulator 5200 includes a cooling box 5210 connected to the circulation passage 5130, and a blower 5220 installed below the cooling box 5210.

The cooling box 5210 includes a box case 5211, and a heat exchanger 5212 fixed to an inner bottom surface of the box case 5211.

A rear surface of the box case 5211 is opened to communicate with the circulation passage 5130, and an opened portion 5211*a* is defined in the bottom surface of the box case 5211 so that the nitrogen gas passing through the heat exchanger 5212 flows downward.

A supplemental nitrogen gas inflow port 5211*b*, through which an external nitrogen gas flows is defined in a side surface of the box case 5211.

The heat exchanger 5212 is provided so that a second cooling fluid S2 flows through an inflow port 5212*a* and a discharge port 5212*b* that are defined in an upper portion of the box case 5211.

The blower 5220 includes a blower case 5221, a blower part 5222 installed inside the blower case 5221, and a filter part 5223 installed below the blower part 5222.

An upper portion of the blower case 5221 has a shape in which a portion at which the cooling box 5210 is installed is opened to communicate.

A side portion of the blower case 5221 has a size greater than a size of the enclosure box 5100 on the XY plane.

The blower part 5222 is provided as a fan filter unit (FFU) that is a known component, and includes a fan 5222*a* and a fan filter 5222*b* installed below the fan 5222*a*. The blower part 5222 is provided in one or plurality.

The filter part 5223 is provided so that a filter member 5223*b* is installed in a housing 5223*a*, and for example, a high efficiency particulate air filter (HEPA) or the like may be used.

The filter part 5223 is required to have a size greater than the size of the enclosure box 5100 on the XY plane.

Hereinafter, operations of the invention will be described.

The operations according to an embodiment of the invention include a circulation-inside-enclosure step, a wafer loading step, a printing step, an ink curing step, and a discharge step.

(1) Circulation-Inside-Enclosure Step

An inkjet printing equipment according to an embodiment of the invention operates to have a state in which a nitrogen gas is circulated inside an enclosure throughout all printing processes.

That is, in an embodiment of the invention, a base nitrogen gas N1 in an enclosure box 5100 flows into a cooling box 5210 through a circulation passage 5130 by an operation of a fan 5222*a* in a blower part 5222.

In the cooling box 5210, the base nitrogen gas N1 flows into a blower 5220 in a state of having a decreased temperature by passing through a heat exchanger 5212 in which a second cooling fluid S2 having a low temperature flows through an inflow port 5212*a* and a discharge port 5212*b*.

Separately from this flow of the base nitrogen gas N1, a supplemental nitrogen gas N2 flows into the cooling box 5210 through a supplemental nitrogen gas inflow port 5211*b* in a side surface of a box case 5211, and is discharged through a supplemental nitrogen gas discharge port 5140 defined in a side surface of the enclosure box 5100.

Through this operation, the nitrogen gas is cooled and supplemented in the cooling box 5210.

This operation allows an inner temperature of the enclosure 5000 to be constantly maintained at about 25 degrees.

The nitrogen gas cooled in the cooling box 5210 passes through the fan 5222*a* and then a fan filter 5222*b*, to flow into a filter part 5223.

As the filter part 5223 is provided to have a plane greater than a plane of an enclosure box 5100, the downflow of the nitrogen gas which passes through the filter part 5223 to flow downward allows everything to move downward over the entirety of the plane of the enclosure box 5100.

Thus, as the operation is performed so that all of dusts, mists or the like generated in the enclosure box 5100 move downward to be discharged, the inside of the enclosure box 5100 is maintained to be clean throughout all the processes in the inkjet printing equipment. Thus, there is an effect that a product defect is prevented from occurring during the inkjet printing process.

(2) Wafer Loading Step

In an embodiment of the invention, an object to be printed by an inkjet printing equipment corresponds to a wafer, a glass substrate, or the like. In this embodiment, the object to be printed is collectively referred to as a wafer for description.

The wafer loading step includes wafer introducing, placing, cooling, and fixing steps.

In the wafer introducing step, a wafer having a high temperature undergone a deposition process that is a previous process is gripped by a wafer transfer unit (not illustrated) to be introduced into the inkjet printing equipment through a wafer inlet 5120 defined in a rear surface of the enclosure 5000.

In the wafer placing step, a roller r installed on an end of a wafer support rod 2122 protrudes from a top surface of a wafer support plate 2350, and then the wafer is supported by this roller r.

In order for the wafer support rod 2122 to protrude from the top surface of the wafer support plate 2350, a work holder body 2300 is required to descend, and this descending is achieved through the following operations.

First, when a first upward moving part 2200 operates a first motor F1 in one direction, a first inclined block F3 moves in the Y-axis backward direction while a first ball screw F2 connected to the first motor F1 rotates.

Due to the movement of the first inclined block F3, a first support plate M1 moves downward, and the work holder body 2300 moves downward due to the first support plate M1.

Here, the downward movement of the first support plate M1 is guided in such a manner that a first side slider F7 installed on a first movement guide member M3 fixed to the first support plate M1 moves along a first side rail F8 installed on a first fixing guide part F6.

As the work holder body 2300 moves downward, a downward movement of a support column 2340 is performed while a support rod guide groove 2341 of a support column 2340 is guided by a support rod 2122.

In addition, a downward movement of a wafer support plate 2350 is performed while a guide groove 2351*a* defined in a cooling plate 2351 and a guide groove 2352*a* defined in a wafer fixing plate 2352 are guided by the support rod 2122.

In an embodiment of the invention, the support rod 2122 is in a state in which a height thereof is fixed. Thus, as the wafer support plate 2350 relatively descends, the support rod 2122 protrudes from above the wafer support plate 2350, and in this state, the wafer is supported to be placed on the wafer support plate 2350.

On the other hand, the first ball screw F2 is reversely rotated to move the work holder body 2300 upward.

The wafer cooling step is performed as follows.

When the temperature of the wafer increases to about 100 degrees or more through the deposition process, the temperature of the wafer becomes about 30 to 40 degrees while passing through a loadlock.

However, the temperature is still relatively high. In particular, expansion of the wafer and deviation of the temperature distribution occur over the entire wafer, and accordingly, a significant defect occurs during the process.

When the wafer is placed on the wafer fixing plate 2352 installed above the wafer support plate 2350, the temperature is detected due to thermal conduction by a temperature sensor 2354 installed on a bottom surface of the wafer fixing plate 2352.

In an embodiment of the invention, a temperature of the wafer fixing plate 2352 may be preset to a required temperature within a temperature range of about 19 to 60 degrees.

Thereafter, a chiller 6000 adjusts a temperature of a first cooling fluid S1 so that the temperature of the wafer fixing plate 2352 detected by the temperature sensor 2354 is continuously maintained to be the preset temperature.

For example, when the temperature detected by the temperature sensor 2354 is higher than the preset temperature, the chiller 6000 is controlled by a controller (not illustrated) to decrease the temperature of the first cooling fluid S1, and supply the first cooling fluid S1 having the decreased temperature to the cooling plate 2351.

Thus, the first cooling fluid S1 having the decreased temperature flows into an inlet 2351*c* of the cooling plate 2351, and flows through a passage 2351*b* to be discharged through an outlet 2351*d*. Accordingly, the temperature of the cooling plate 2351 is decreased by the continuous flow of the cooled first cooling fluid S1 so that the temperature of the wafer is decreased.

Thus, as the wafer having expanded in a process before being introduced into the inkjet printing equipment according to an embodiment of invention is cooled inside the inkjet printing equipment, the initial shape of the wafer is maintained to prevent an occurrence of a printing defect due to the wafer expansion in the following printing process.

As an atmospheric temperature of the nitrogen gas inside the enclosure 5000 is maintained to be constant, for example, at about 25 degrees, and the temperature of the wafer inside the inkjet apparatus is also constantly maintained at the same temperature, printing quality is uniformly maintained in the process using the inkjet printing equipment.

Next, the wafer fixing step is performed.

The fixing of the wafer to the wafer fixing plate 2352 is performed after the wafer cooling step is completed.

In the wafer fixing step, a vacuum pump (not illustrated) disposed outside the inkjet printing equipment is operated to allow a vacuum to flow into a vacuum suction hole 2352*c* so that the vacuum is operated in a vacuum adsorption hole 2352*b*, and to maintain a vacuum state while discharging the vacuum through a vacuum discharge hole 2352*d* so that the wafer is fixed to the wafer support plate 2350.

Then, when a position at which the wafer is fixed is detected, and the wafer is not properly disposed, a UVW stage 1300 is adjusted to align the wafer at an accurate position.

(3) Printing Step

The printing step includes a printing performing step and an inkjet inspecting step.

In the printing performing step, a work holder 2000 to which the wafer is fixed is moved by a work holder moving part 1200 in the Y-axis direction.

In the work holder moving part 1200, as electric current is applied to an inner winding of a first mover L3, and the first mover L3 moves along first rails L2 due to interaction with a first stator L1, and accordingly, a first movable member L4 moves.

As a work holder bottom member 2001 on which the work holder 2000 is installed is fixed to the first movable member L4, the work holder 2000 to which the wafer is fixed is moved by the movement of the first movable member L4 in the Y-axis forward direction.

When the wafer reaches a printing position in the Y-axis direction, a head part 3000 sprays an ink onto the wafer while being moved by a head part moving part 1400 in the X-axis direction, and at the same time, the work holder 2000 performs a printing operation while moving the Y-axis direction.

The operation in which the head part 3000 moves in the X-axis direction is performed as follows.

The head part 3000 is provided inside the chamber 3100, and a rear surface of the chamber 3100 is installed on a second movable member L4-1.

As electric current is applied to an inner winding of a second mover L3-2 of a head part moving part 1400, the second mover L3-2 moves along second rails L2-1 due to interaction with a second stator L1-1, and accordingly, the second movable member L4-1 moves so that the head part 3000 is moved in the X-axis direction.

The inkjet inspecting step is performed in a head inspecting part 3400 when necessary, after the printing performing step is completed.

In the inkjet inspecting step, the head inspecting part 3400 is moved by a second upward moving part 3410 in the Z-axis upward direction, and a purging cup 3440 covers a head 3300 to be sealed.

The operation by the second upward moving part 3410 is performed in a manner substantially similar to the first upward moving part 2200. A second support plate M1-1 moves upward, and as a first horizontal support part 3421 having a flat plate shape, which is fixed on the second support plate M1-1, moves upward, the purging cup 3440 and an inspecting part 3450 that are installed on the second support plate M1-1 move in the Z-axis upward direction.

The inspecting part 3450 is disposed at a proper position on an X axis and a Y axis to be suitable for inspecting whether an ink is normal or not, by an X-axis directional movement unit 3431 and a Y-axis directional movement unit 3432.

Then, when the head 3300 sprays the ink into the purging cup 3440, an inspection on the ink spray is performed as light emitted by an illuminator 3452 passes through the ink and then is input into a camera part 3453.

The second upward moving part 3410 operates reversely after the ink inspection is completed, so that the head inspecting part 3400 moves downward again.

(4) Curing Step

The curing step includes a curing position moving step, an upward moving step, and a curing step.

In the curing position moving step, after the printing work is completed, the work holder 2000 to which the wafer is fixed is moved in the Y-axis backward direction by the work holder moving part 1200 to be disposed right below an ink curing part 4000.

Then, in the upward moving step, the work holder body 2300 is moved upward by an operation of a first upward moving part 2200 to be moved to a height h2 at which the work holder body 2300 is in contact with the ink curing part 4000.

The upward moving step is performed so that the wafer fixing plate 2352 is inserted into a second stepped groove 4111*c* to press a second sealing 4122.

In the curing step, in a state in which a curing device 4200 is operated, a curing device moving part 4300 drives a third motor M3 to operate a third ball screw BS3, and accordingly, the curing device 4200 performs the operation of curing the ink sprayed onto the wafer while moving along a third slider SL3, on which the curing device 4200 is installed, in the Y-axis direction.

Ultraviolet light emitted by the curing device 4200 is primarily blocked by the second sealing 4122 installed on a glass plate fixing member 4110.

In addition, the ultraviolet light is secondarily blocked by a first sealing 2412 provided along an inner perimeter of an opened groove 2411 of a first cover part 2410.

Due to this double blocking effect, the ultraviolet light is blocked without leakage to the outside of a work holder cover part 2400 while the curing operation is performed.

Due to this operation, there is an effect that inks, dusts, or the like scattered inside the inkjet printing equipment are prevented from being cured.

In addition, when the curing step is performed, the inspecting part 3450 may move upward so that the purging cup 3440 covers the head 3300.

Accordingly, the ink remaining on the head 3300 is blocked by the purging cup 3440 having an ultraviolet blocking operation. Thus, the ink remaining on the head 3300 is prevented from being cured in the curing step, and accordingly, the printing operation is smoothly performed.

Moreover, also in the curing step, when the temperature of the wafer fixing plate 2352 detected by the temperature sensor 2354 is different from a predetermined temperature due to the ultraviolet light generated in the curing device, i.e., when the temperature is increased, the chiller 6000 is controlled by a controller (not illustrated) to decrease the temperature of the first cooling fluid S1, and supply the first cooling fluid S1 having the decreased temperature to the cooling plate 2351.

Thus, as the temperature of the wafer is prevented from being increased in the curing step, a product defect due to the wafer expansion is prevented from occurring in a process following the process in the inkjet printing equipment.

(5) Unloading Step

In the wafer discharging step, first, the first upward moving part 2200 is reversely driven to move the work holder 2000 having been moved upward in the Z-axis downward direction. Accordingly, the work holder 2000 is disposed at the same height as a height for unloading the wafer.

Then, the wafer is unloaded to the outside of the inkjet printing equipment by an external wafer transfer unit.

In an embodiment of the invention, as the ink curing part 4000 is installed at a rear side of the enclosure 5000 in the Y-axis direction, there is an effect that the wafer is capable of being unloaded right after the curing step so that a process time is reduced.

The advantages of an embodiment of the invention are summarized as follows. As the printing step and the curing step are basically performed inside one enclosure 5000, the equipment is reduced in size as a whole and becomes compact.

Moreover, as the printing and curing devices are provided inside one enclosure 5000, a cost price of the equipment is reduced, and foreign matters are prevented from being introduced during the transfer for each process when compared to a case in which each process is performed in an equipment provided with a separate device.

In addition, in an embodiment of the invention, as described above, the leakage of the ultraviolet light to the outside of the work holder is prevented by the work holder cover part, and the head is also blocked by an ultraviolet blocking transparent cap. Accordingly, even when the curing step is performed inside one enclosure 5000, there is the effect that inks, foreign matters, or the like inside the enclosure 5000 are prevented from being cured by the ultraviolet light.

In an embodiment of the invention, the downflow is generated by the filter part having a larger size than the enclosure box throughout the inkjet printing process. Accordingly, the inside of the enclosure is maintained at the clean state to have the effect of improving the printing quality.

Moreover, in order to fundamentally prevent foreign matters such as dusts from occurring inside the inkjet printing equipment, the head part does not move in the Z-axis direction and the head inspecting part moves in the Z-axis direction, and also, the curing device does not move in the Z-axis direction and the work holder moves in the Z-axis upward direction. Accordingly, dusts are prevented in advance from occurring inside the enclosure 5000 to improve the clean state so that the printing quality is improved.

As the wafer having a shape distorted by being heated due to the deposition process is cooled, and then the printing step is performed, there is the effect of improving the printing quality.

Moreover, as the curing step also serves to prevent the deformation such as wafer expansion caused by curing, there is an advantage that an occurrence of a process defect due to the wafer deformation is prevented also in the following process.

The embodiments set forth herein are to describe the technical spirit of the invention and should not be interpreted as limiting the scope of the technical spirit of the invention. Also, all technical concepts coming within the equivalency range of the present application should be interpreted to be in the scope of the right of the present application.

What is claimed is:

1. An inkjet printing equipment comprising:

a work holder configured to fix an object to be printed;

a work holder moving part configured to allow the work holder to be linearly movable in a Y-axis direction;

a base on which the work holder moving part is installed;

a head part installed on the base, and configured to spray an ink onto the object to be printed;

a head part moving part configured to move the head part in an X-axis direction, and installed above the base;

an ink curing part installed above the work holder and on a moving path of the work holder in the Y-axis direction; and an enclosure configured to cover all of the work holder, the head part, and the ink curing part, wherein the work holder includes:

a wafer support part installed on the work holder moving part;

a first upward moving part installed inside the wafer support part; and a work holder body installed above the first upward moving part, wherein the first upward moving part is provided to allow the work holder body to be movable in a Z-axis direction, wherein the work holder body includes:

support columns extending from an upper portion of a first support plate in the Z-axis upward direction; and a wafer support plate installed on an upper end of the support columns, wherein the support columns are provided in four and installed at corners to correspond, respectively, to the wafer support rods provided on the support, wherein the support columns are provided at positions such that, when the work holder body moves in the Z-axis direction, an interference of the horizontal support does not occur, wherein a support rod guide groove, which extends in the Z-axis direction so that when the work holder body moves in the Z-axis direction, each of the wafer support rods is guided, is defined in an inner side of each of the support columns, wherein the work holder further includes a work holder cover part, wherein the work holder cover part includes a first cover part configured to cover the wafer support part and the first upward moving part, and a second cover part configured to cover the work holder body, wherein the first cover part has an upper portion that is opened to be fixed to the work holder moving part, wherein an opened groove, which has an upper portion that is opened so that the work holder body is movable in the Z-axis direction, is defined in an upper portion of the first cover part, wherein a first sealing is installed along an inner perimeter of the opened groove, wherein an opened portion is defined so that upper and lower portions of the second cover part are opened, wherein the upper portion of the second cover part is fixed to the wafer support plate so that when the work holder body moves in the Z-axis direction, the second cover part moves together, wherein a first flange having a flat plate shape is provided along a lower perimeter of the second cover part so as to be in contact with the first sealing when the work holder body moves upward.

2. The inkjet printing equipment according to claim 1, wherein the wafer support part includes:

a support installed to extend upward from the work holder moving part; and a wafer support member installed on an upper portion of the support, wherein the wafer support member includes a horizontal support extending from an upper end of the support inward in an XY plane and having a triangular flat plate shape, and wafer support rods extending upward from respective ends of the horizontal support, wherein each of the wafer support rods includes a horizontal member installed to further extend inward from the horizontal support, and a vertical member provided at an upper side with respect to the horizontal member, wherein two rollers are installed on an upper end of the vertical member of each of the wafer support rods to have different heights in the Z-axis direction.

3. The inkjet printing equipment according to claim 2, wherein the first upward moving part includes a first upward driving part installed on the work holder moving part, and a first relatively movable part installed above the first upward driving part wherein the first upward driving part includes a first ball screw, which is installed to extend from a bottom surface having a flat plate shape of a work holder bottom member in the Y-axis direction and is driven by a first motor, and a first inclined block which is linearly moved by the first ball screw, wherein a first lower rail part, on which a first lower slider is installed, is installed below the first inclined block, and a bottom surface of the first inclined block is fixed to the first lower slider, wherein the first inclined block is provided to be inclined so that a height of a top surface of the first inclined block gradually increases in a Y-axis backward direction, wherein a first fixing guide part extending in a Z-axis upward direction is installed at each of both sides of the first inclined block, and a first side rail, which extends in the Z-axis upward direction and on which a first side slider is installed, is provided outside the first fixing guide part, wherein there first relatively movable part includes the first support plate, a first inclined part installed below a center of the first support plate, and a first movement guide member installed at each of both sides of the first inclined part, wherein a bottom surface of the first inclined part is provided to be inclined so that the first inclined part has a shape corresponding to a top surface of the first inclined block, wherein a first upper rail, on which a first upper slider is installed, is installed on the bottom surface of the first inclined part, and the top surface of the first inclined block is fixed to the first upper slider, wherein the first movement guide member is provided to extend in the Z-axis upward direction, and an inner side of the first movement guide member is fixed to the first side slider.

4. The inkjet printing equipment according to claim 3, wherein the wafer support plate includes a cooling plate installed on a lower portion thereof, and a wafer fixing plate installed above the cooling plate, wherein a guide groove is defined in an edge of the cooling plate so that each of the wafer support rods is movable in the Z-axis direction, a passage through which a first cooling fluid flows is defined at a center of the cooling plate, and an inlet and an outlet which communicate with the passage are defined in a side surface of the cooling plate, wherein a guide groove is defined in the wafer fixing plate so that each of the wafer support rods is movable in the Z-axis direction, a vacuum adsorption hole through which the wafer is fixed is defined at a center of the wafer fixing plate, and a vacuum suction hole and a vacuum discharge hole which communicate with the vacuum adsorption hole are defined in a side surface of the wafer fixing plate, wherein a temperature sensor is installed on a bottom surface of the wafer fixing plate, wherein the inlet and the outlet are connected to a chiller, wherein the chiller adjusts a temperature of the first cooling fluid so that a temperature detected by the temperature sensor is maintained to be a preset temperature.

5. The inkjet printing equipment according to claim 4, wherein the head part includes:

a chamber having a rear surface fixed to the head part moving part;

a head driving part installed inside the chamber;

a head installed below the head driving part, driven by the head driving part, and protruding from a lower portion of the chamber; and a head inspecting part installed below the head part.

6. The inkjet printing equipment according to claim 5, wherein the head inspecting part includes:

a second upward moving part installed on the base;

a purging cup support part installed above the second upward moving part and provided with a purging cup;

an inspecting part configured to inspect an ink sprayed into the purging cup; and an inspecting part moving part configured to allow the inspecting part to be movable in one the X-axis and Y-axis directions with respect to the purging cup, wherein the second upward moving part is provided to allow the purging cup support part to be movable in the Z-axis direction so that the purging cup covers the head.

7. The inkjet printing equipment according to claim 6, wherein the purging cup support part includes:

a first horizontal support part fixed to the second upward moving part and having a flat plate shape;

a vertical support part extending vertically from the first horizontal support part; and a second horizontal support part fixed to the vertical support part and having a flat plate shape, wherein the inspecting part moving part is installed on the first horizontal support part, wherein the purging cup is installed on the second horizontal support part.

8. The inkjet printing equipment according to claim 7, wherein the purging cup includes:

a case installed on the purging cup support part;

a transparent part installed above the case; and a discharge passage which is installed on the case through which the sprayed ink is discharged, wherein the transparent part is provided so that ultraviolet light is blocked.

9. The inkjet printing equipment according to claim 8, wherein the ink curing part includes:

a case installed at an upper side inside the enclosure; and a curing device installed inside the case.

10. The inkjet printing equipment according to claim 9, wherein an opened groove having a rectangular shape penetrated downward, and provided to be stepped downward is defined in a bottom surface of the case, wherein a glass plate fixing member is installed below the stepped opened groove, wherein the glass plate fixing member includes a frame provided to be stepped to have a shape corresponding to the stepped opened groove, and a glass plate installed at a center of the frame, wherein an extension extending inward to support the glass plate is provided on an upper portion of the frame, a first stepped groove is defined along an inner perimeter of the frame, and a second stepped groove having a greater width is defined below the first stepped groove, wherein a second flange having a shape corresponding to the stepped opened groove is provided along an outer lower perimeter of the frame, wherein a sealing member fixed to a lower portion of the glass plate fixing member includes a frame member having a center in which a through-groove is defined, and a second sealing provided along an inner perimeter of the through-groove.

11. The inkjet printing equipment according to claim 10, wherein the ink curing part is operated after the work holder body is moved upward by the first upward moving part so that the wafer fixing plate presses the second sealing, and the first flange presses the first sealing.

12. The inkjet printing equipment according to claim 11, wherein the ink curing part is further operated after the purging cup is moved upward by the second upward moving part to cover the head.

13. The inkjet printing equipment according to claim 12, wherein the enclosure includes:

an enclosure box configured to cover all of the work holder, the head part, and the ink curing part; and a circulator installed above the enclosure box, wherein the enclosure box has a shape having an upper portion and a lower portion that are opened, wherein a glove box, in which rubber gloves for maintenance and repairs of the inkjet printing equipment are installed, is defined in a front surface or a side surface of the enclosure box, wherein a wafer inlet into which the wafer is inserted in the Y-axis direction is defined in one side of a rear surface of the enclosure box, wherein, in the other side of the rear surface of the enclosure box, a circulation inlet which allows a nitrogen gas filled in the enclosure to flow is defined, and a circulation passage extending in the Z-axis direction to communicate with the circulation inlet is defined.

14. The inkjet printing equipment according to claim 13, wherein the circulator includes:

a cooling box connected to the circulation passage; and a blower installed below the cooling box, wherein the cooling box includes a box case installed above the blower, and a heat exchanger fixed to an inner bottom surface of the box case, wherein a rear surface of the box case is opened to communicate with the circulation passage, and an opened portion is defined in a bottom surface of the box case so as to communicate to allow the nitrogen gas passing through the heat exchanger to flow downward, wherein the heat exchanger is provided so that a second cooling fluid flows through an inflow port and a discharge port that are defined in an upper portion of the box case.

15. The inkjet printing equipment according to claim 14, wherein the blower includes:

a blower case installed above the enclosure box;

a blower part installed inside the blower case; and a filter part installed below the blower part, wherein the filter part has a size greater than a size of the enclosure box on the XY plane.

16. The inkjet printing equipment according to claim 15, wherein, when the curing device is operated, the chiller adjusts the temperature of the first cooling fluid so that the temperature detected by the temperature sensor is maintained to be the preset temperature.

* * * * *